US008048798B2

(12) United States Patent
Kidoh et al.

(10) Patent No.: US 8,048,798 B2
(45) Date of Patent: Nov. 1, 2011

(54) METHOD FOR MANUFACTURING A NONVOLATILE SEMICONDUCTOR STORAGE DEVICE WHERE MEMORY CELLS ARE ARRANGED THREE DIMENSIONALLY

(75) Inventors: Masaru Kidoh, Komae (JP); Masaru Kito, Yokohama (JP); Ryota Katsumata, Yokohama (JP); Yoshiaki Fukuzumi, Yokohama (JP); Hiroyasu Tanaka, Tokyo (JP); Megumi Ishiduki, Yokohama (JP); Yosuke Komori, Yokohama (JP); Hideaki Aochi, Kawasaki (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 12/389,977

(22) Filed: Feb. 20, 2009

(65) Prior Publication Data

US 2009/0224309 A1 Sep. 10, 2009

(30) Foreign Application Priority Data

Mar. 4, 2008 (JP) ................................ 2008-053170

(51) Int. Cl.
*H01L 21/4763* (2006.01)

(52) U.S. Cl. ......................................... 438/639; 216/39

(58) Field of Classification Search .................. 438/639; 216/39

See application file for complete search history.

(56) References Cited

U.S. PATENT DOCUMENTS 5,599,724 A 2/1997 Yoshida
5,707,885 A 1/1998 Lim
6,287,957 B1 * 9/2001 Linliu .......................... 438/634
6,861,686 B2 * 3/2005 Lee et al. ...................... 257/291
2007/0252201 A1 11/2007 Kito et al.
2008/0076244 A1 * 3/2008 Ye et al. ........................ 438/597

FOREIGN PATENT DOCUMENTS

JP 2007-266143 10/2007

OTHER PUBLICATIONS

U.S. Appl. No. 12/708,161, filed Feb. 18, 2010, Fukuzumi et al.
U.S. Appl. No. 12/709,702, filed Feb. 22, 2010, Fukuzumi et al.
U.S. Appl. No. 12/679,991, filed Mar. 25, 2010, Fukuzumi, et al.

* cited by examiner

*Primary Examiner* — Thao Le
*Assistant Examiner* — Allen Parker
(74) *Attorney, Agent, or Firm* — Oblon, Spivak, McClelland, Maier & Neustadt, L.L.P.

(57) ABSTRACT

A method for manufacturing a nonvolatile semiconductor storage device, including: forming a first conductive layer so that it is sandwiched in an up-down direction by first insulating layers; forming a first hole so that it penetrates the first insulating layers and the first conductive layer; forming a first side wall insulating layer on a side wall facing the first hole; forming a sacrificing layer so that the sacrificing layer infills the first hole; forming a second conductive layer on an upper layer of the sacrificing layer so that the second conductive layer is sandwiched by the second insulating layer in an up-down direction; forming a second hole on a position which matches with the first hole so that the second hole penetrates the second insulating layer and the second conductive layer; forming a second side wall insulating layer on a side wall facing the second hole; removing the sacrificing layer after the formation of the second side wall insulating layer; and forming a semiconductor layer so that the semiconductor layer infills the first hole and the second hole after the removal of the sacrificing layer.

9 Claims, 24 Drawing Sheets

ROW DIRECTION
45 34 26 75 74 73 76 25 71 71a 72 71a 71 Ph 12 27 28 35 36 46 47 48a 44 43 42 41 33 33a 31e 32d 31d 32c 31c 32b 31b 32a 31a 24 23 22 21 Ba1 Ba2 Ba

LAMINATED DIRECTION
ROW DIRECTION
COLUMN DIRECTION
15: DRAIN SIDE SELECTING GATE LINE DRIVING CIRCUIT
100: NONVOLATILE SEMICONDUCTOR STORAGE DEVICE
12: MEMORY TRANSISTOR AREA
BIT LINE BL
DRAIN SIDE SELECTING GATE LINE SGD
13: WORD LINE DRIVING CIRCUIT
WORD LINE WL
16: SENSE AMPLIFIER
SOURCE SIDE SELECTING GATE LINE SGS
14: SOURCE SIDE SELECTING GATE LINE DRIVING CIRCUIT

LAMINATED DIRECTION
ROW DIRECTION
COLUMN DIRECTION
MS: MEMORY STRING
DRAIN SIDE SELECTING TRANSISTOR (SDTrmn)
MEMORY TRANSISTOR (MTr1mn～MTr4mn)
SOURCE SIDE SELECTING TRANSISTOR (SSTrmn)
BL1
BL2
BL3
SGD1
SGD2
SGD3
SGD4
WL1
WL2
WL3
WL4
SGS
Ba
Ba1
CLmn ROW DIRECTION
50
40
30
20
Ba2
Ba1
Ba
12
Ph
55
54
53
52
51
62
63
44
43
42
41
33
33a
31e
32d
31d
32c
31c
32b
31b
32a
31a
24
23
22
21
46
47
48
35
36
37
27
28
29
56a
56b
56c
57a
57b
57c
58a
58b
58c
61a
61b
61c
61d
61e
61f
61g
61h
61i
61j
45
34
26
25
70
71
71a
72
73
74
75
76

ROW DIRECTION
24
23
22
21
Ba1
Ba2
Ba
12
25
71
71a
72
Ph
75
74
73
76
26
71

ROW DIRECTION
24
23
22
21
Ba2
Ba1
Ba
27
28
29a
12
25
71
71a
Ph
72
75
74
76
73
26

ROW DIRECTION
24
23
22
21
Ba2
Ba1
Ba
27
28
81
12
25
71
71a
Ph
72
75
74
73
76
26

ROW DIRECTION
33a
31e
32d
31d
32c
31c
32b
31b
32a
31a
24
23
22
21
Ba1
Ba2
Ba
35
36
37a
27
28
81
12
25
71
71a
Ph
72
73
74
75
76
26

ROW DIRECTION
33a
31e
32d
31d
32c
31c
32b
31b
32a
31a
24
23
22
21
Ba1
Ba2
Ba
35
36
82
27
28
81
12
25
71
71a
Ph
72
75
74
73
76
26

ROW DIRECTION
44
43
42
41
33
33a
31e
32d
31d
32c
31c
32b
31b
32a
31a
24
23
22
21
Ba2
Ba1
Ba
35
36
82
27
28
81
12
25
71
71a
72
Ph
75
74
76
73
4
26

ROW DIRECTION
44
43
42
41
33
33a
31e
32d
31d
32c
31c
32b
31b
32a
31a
24
23
22
21
Ba1
Ba2
Ba
46
35
36
82
27
28
81
12
25
71
71a
72
Ph
75
74
76
73
45
34
26

ROW DIRECTION
44
43
42
41
33
33a
31e
32d
31d
32c
31c
32b
31b
32a
31a
24
23
22
21
Ba1
Ba2
Ba
46
47
48a
35
36
27
28
12
25
71
71a
Ph
72
73
74
75
76
45
34
26

ROW DIRECTION

METHOD FOR MANUFACTURING A NONVOLATILE SEMICONDUCTOR STORAGE DEVICE WHERE MEMORY CELLS ARE ARRANGED THREE DIMENSIONALLY

CROSS-REFERENCE TO RELATED APPLICATIONS

This application is based upon and claims the benefit of priority from the prior Japanese Patent Application No. 2008-53170, filed on Mar. 4, 2008, the entire contents of which are incorporated herein by reference.

BACKGROUND OF THE INVENTION

1. Field of the Invention

The present invention relates to a nonvolatile semiconductor storage device which can electrically rewrite data and a manufacturing method thereof.

2. Description of the Related Art

Conventionally, elements are integrated in a two-dimensional plane on a silicon substrate to form an LSI. In order to increase a memory storage capacity, a dimension of one element should be decreased (miniaturize), but the miniaturization becomes difficult from viewpoints of the cost and the technique. The technique of photolithography should be improved for the miniaturization, but for example, about 40 nm is a resolution limit in a current ArF immersion exposing technique, and thus introduction of a EUV exposing machine is necessary for further miniaturization. However, the EUV exposing machine is expensive, and thus is not realistic from the viewpoint of the cost. Even if the miniaturization is achieved, it is expected that with stand pressure between elements or the like reaches physical breaking point, as long as a driving voltage is not scaled. That is to say, an operation as a device is most likely to become difficult.

In recent years, therefore, in order to increase an integration degree of a memory, a lot of semiconductor storage devices where memory cells are arranged three dimensionally are proposed (see Patent Document 1: Japanese Patent Application Laid-Open No. 2007-266143, Patent Document 2: U.S. Pat. No. 5,599,724, and Patent Document 3: U.S. Pat. No. 5,707,885).

One of the conventional semiconductor storage devices where memory cells are arranged three dimensionally is a semiconductor storage device using a transistor with a cylindrical structure (Patent Documents 1 through 3). In the semiconductor storage device using the transistor with the cylindrical structure, a laminated-conductive layers with plural laminated layers as a gate electrode, and a pillar-shaped semiconductor are provided. The pillar-shaped semiconductor serves as a channel (body) section of the transistor. A memory gate insulating layer which can accumulate charges is provided around the pillar-shaped semiconductor. A structure including the laminated conductive layer, the pillar-shaped semiconductor, the memory gate insulating layer is called as a memory string.

In the semiconductor storage device having the memory string, the pillar-shaped semiconductor is formed by laminating amorphous silicon or the like in a plurality of batches. Therefore, in the pillar-shaped semiconductor, a natural oxide film is likely to be formed on an interface between the laminated layers. The natural oxide film raises the resistance of the whole pillar-shaped semiconductor, and thus there is a problem that an electric current reduces.

SUMMARY OF THE INVENTION

From one aspect of the present invention, a nonvolatile semiconductor storage device having a plurality of memory strings where a plurality of electrically rewritable memory cells is connected in series, and a first selecting transistor connected to one ends of the memory strings, the memory string including: a first pillar-shaped portion which extend to a direction vertical to a substrate, and a first conductive layer which is formed so as to sandwich a first side wall insulating layer together with the first pillar-shaped portion and serves as control electrodes of the memory cells, the first selecting transistor including: a second pillar-shaped portion which contacts with a lower surface of the first pillar-shaped portion and extends downward; and a second conductive layer which is positioned below the first conductive layer and is formed so as to sandwich the second side wall insulating layer together with the second pillar-shaped semiconductor layer, and serves as a control electrode of the first selecting transistor, the second pillar-shaped portion being formed continuously to be integral with the first pillar-shaped portion.

From one aspect of the present invention, a nonvolatile semiconductor storage device having a plurality of memory strings where a plurality of electrically rewritable memory cells is connected in series, and a first selecting transistor connected to one ends of the memory strings, the memory string including: a first pillar-shaped portion which extend to a direction vertical to a substrate, and a first conductive layer which is formed so as to sandwich a first side wall insulating layer together with the first pillar-shaped portion and serves as control electrodes of the memory cells, the first selecting transistor including: a second pillar-shaped portion which contacts with an upper surface of the first pillar-shaped portion and extends upward; and a second conductive layer which is positioned above the first conductive layer and is formed so as to sandwich the second side wall insulating layer together with the second pillar-shaped portion, and serves as a control electrode of the first selecting transistor, the second pillar-shaped portion being formed continuously to be integral with the first pillar-shaped portion.

From one aspect of the present invention, a method for manufacturing a nonvolatile semiconductor storage device, comprising: forming a first conductive layer so that it is sandwiched in an up-down direction by first insulating layers; forming a first hole so that it penetrates the first insulating layers and the first conductive layer; forming a first side wall insulating layer on a side wall facing the first hole; forming a sacrificing layer so that the sacrificing layer infills the first hole; forming a second conductive layer on an upper layer of the sacrificing layer so that the second conductive layer is sandwiched by the second insulating layer in an up-down direction; forming a second hole on a position which matches with the first hole so that the second hole penetrates the second insulating layer and the second conductive layer; forming a second side wall insulating layer on a side wall facing the second hole; removing the sacrificing layer after the formation of the second side wall insulating layer; and forming a semiconductor layer so that the semiconductor layer infills the first hole and the second hole after the removal of the sacrificing layer.

DETAILED DESCRIPTION OF THE EMBODIMENTS

A nonvolatile semiconductor storage device according to an embodiment of the present invention is described below with reference to the drawings.

(Structure of Nonvolatile Semiconductor Storage Device 100 According to Embodiment)

Figure 1:
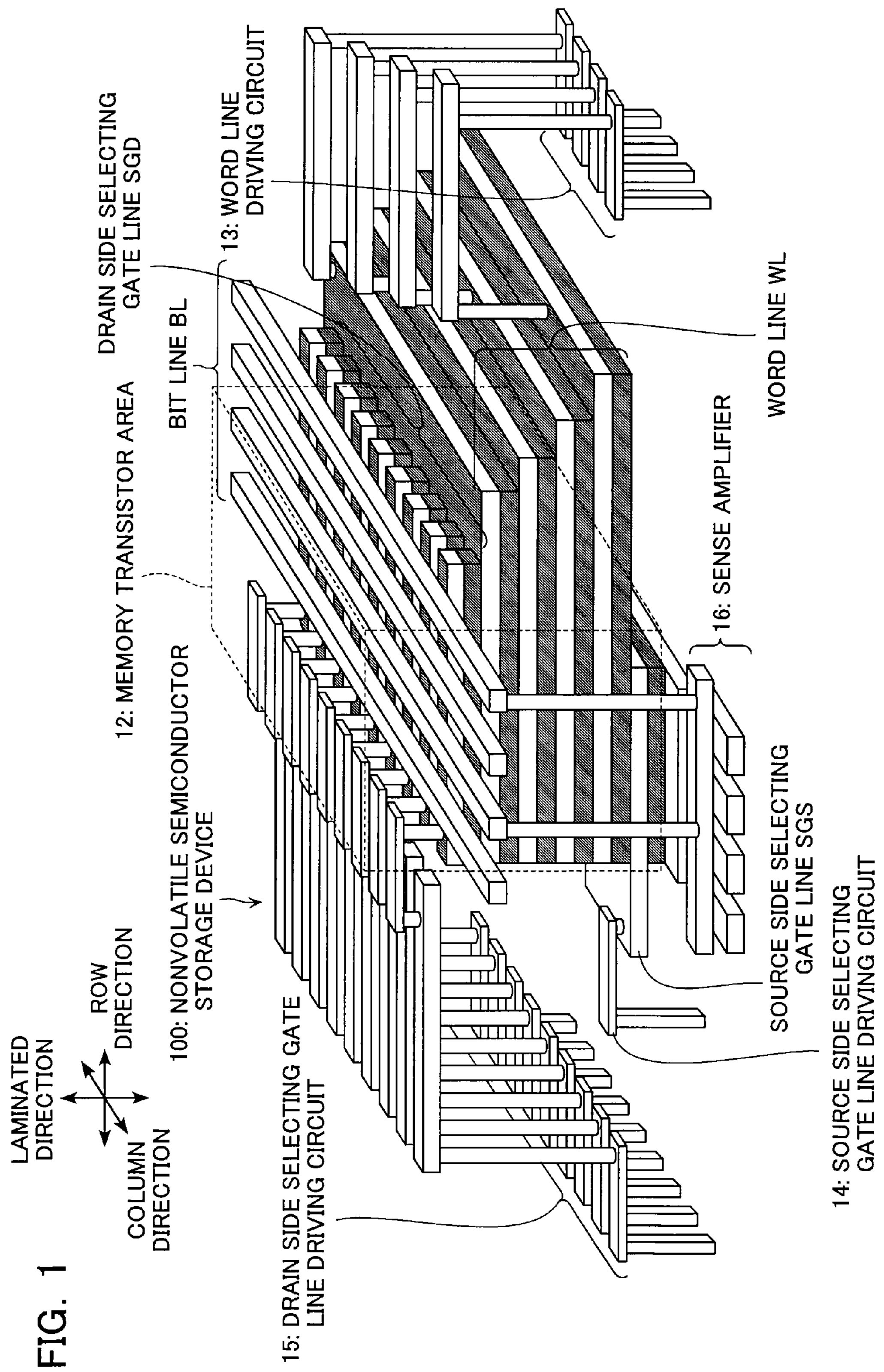
FIG. 1 is a structural schematic diagram illustrating a nonvolatile semiconductor storage device according to an embodiment of the present invention.

FIG. 1 is a schematic diagram illustrating the nonvolatile semiconductor storage device 100 according to an embodiment of the present invention. As shown in FIG. 1, the nonvolatile semiconductor storage device 100 according to the embodiment mainly has a memory transistor area 12, a word line driving circuit 13, a source side selecting gate line (SGS) driving circuit 14, a drain side selecting gate line (SGD) driving circuit 15, and a sense amplifier 16. The memory transistor area 12 has a memory transistor which stores data. The word line driving circuit 13 controls a voltage to be applied to the word line WL. The source side selecting gate line (SGS) driving circuit 14 controls a voltage to be applied to the source side selecting gate line SGS. The drain side selecting gate line (SGD) driving circuit 15 controls a voltage to be applied to the drain side selecting gate line (SGD). The sense amplifier 16 senses current (or potential) in the bit lines BL, amplifies it, and determines electrically stored data in the memory cell. The nonvolatile semiconductor storage device 100 according to the embodiment further has a bit line driving circuit which control a voltage to be applied to a bit line BL, and a source line driving circuit which controls a voltage to be applied to a source line SL (not shown).

As shown in FIG. 1, in the nonvolatile semiconductor storage device 100 according to the embodiment, the memory transistor composing the memory transistor area 12 is formed by laminating a plurality of semiconductor layers. As shown in FIG. 1, the word lines WL on the respective layers are formed so as to spread two dimensionally in a horizontal direction. The word lines WL on the respective layers have plate-shaped planer structures composed of the same layers, respectively.

Figure 2:
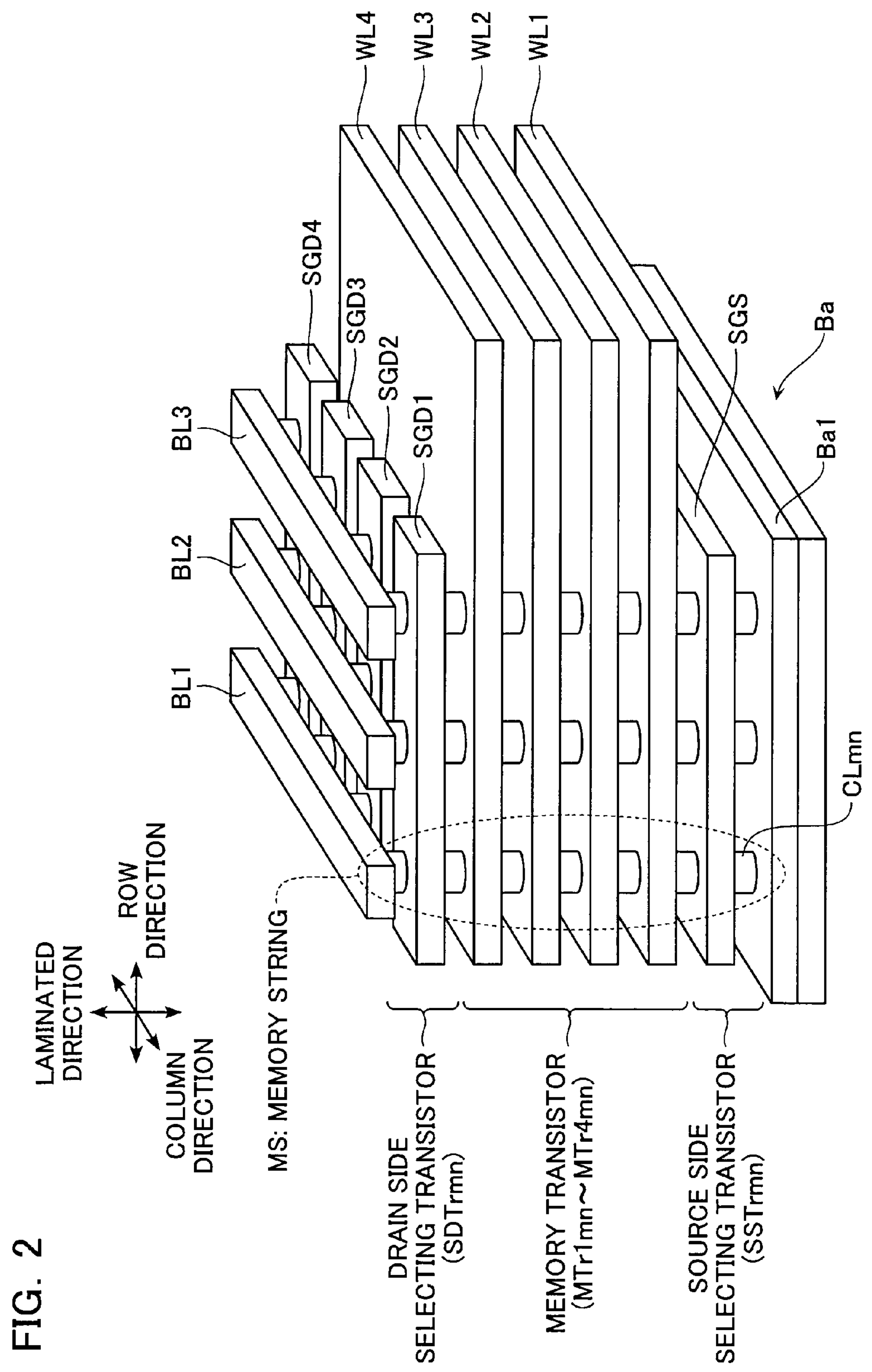
FIG. 2 is a partially schematic perspective view illustrating a memory transistor area 12 of the nonvolatile semiconductor storage device according to the embodiment of the present invention.

FIG. 2 is a partially schematic perspective view illustrating the memory transistor area 12 of the nonvolatile semiconductor storage device 100 according to the embodiment. In the embodiment, the memory transistor area 12 has memory transistors (MTr1_mn_ to MTr4_mn_), and m×n of memory strings MS composed of a source side selecting transistor SSTrmn and a drain side selecting transistor SDTrmn (m and n are natural numbers). FIG. 2 shows an example where m=3 and n=4.

The word lines (WL1 to WL4) which are connected to gates of the memory transistors (MTr1_mn_ to MTr4_mn_) of the memory strings MS, respectively, are formed by the same conductive film, and are commonly connected. That is to say, all gates of the memory transistor MTr1_mn_ of the memory string MS are connected to the wordline WL1. Further, all gates of the memory transistor MTr2_mn_ of the memory string MS are connected to the word line WL2. All gates of the memory transistor Mtr3_mn_ of the memory string MS are connected to the word line WL3. All gates of the memory transistor MTr4_mn_ of the memory string MS are connected to the word line WL4. In the nonvolatile semiconductor storage device 100 according to the embodiment, as shown in FIGS. 1 and 2, the word lines WL1 to WL4 are formed so as to spread two dimensionally in a horizontal direction parallel with a semiconductor substrate Ba. The word lines WL1 to WL4 are arranged approximately vertically to the memory strings MS. End portions of the word lines WL1 to WL4 in a row direction are formed in a staircase pattern. The row direction is a direction perpendicular to a vertical direction, and a column direction is a direction perpendicular to the vertical direction and the row direction.

Each memory string MS has a pillar-shaped semiconductor CLmn (in FIG. 2, m=1 to 3, n=1 to 4) on an n+ area (Ba2, described later) formed on a P-well area Ba1 of the semiconductor substrate Ba. Each pillar-shaped conductor CLmn is formed in the vertical direction with respect to the semiconductor substrate Ba, and is arranged into a matrix pattern on the semiconductor substrate Ba and a plane of the word lines (WL1 to WL4). That is to say, also the memory strings MS are arranged into a matrix pattern on a plane vertical to the pillar-shaped semiconductors CLmn. The pillar-shaped semiconductor CLmn may have a cylindrical or prismatic shape. The pillar-shaped semiconductor CLmn includes a pillar-shaped semiconductor having a stepped shape.

As shown in FIG. 2, rectangular-shaped drain side selecting gate lines SGD (in FIG. 2, SGD1 to SGD4) composing the drain side selecting transistors SDTrmn are provided on upper portions of the memory strings MS via the pillar-shaped semiconductors CLmn and an insulating film (not shown). The drain side selecting gate lines SGD are separated to be insulated from each other, extend to the row direction and are provided repeatedly in the column direction so as to be formed into a line shape differently from the wordlines WL1 to WL4. The pillar-shaped semiconductors CLmn are provided so as to penetrate the center of the drain side selecting gate lines SGD in the column direction.

As shown in FIG. 2, a source side selecting gate line SGS composing the source side selecting transistor SSTrmn is provided on a lower portion of the memory string MS via the pillar-shaped semiconductor CLmn and an insulating film (not shown). The source side selecting gate line SGS is formed so as to spread two dimensionally in the horizontal direction similarly to the word lines WL1 to WL4. The source side selecting gate line SGS has the structure shown in FIG. 2, or may have a reed shape such that it extends in the row direction and is provided repeatedly in the column direction.

Figure 3:
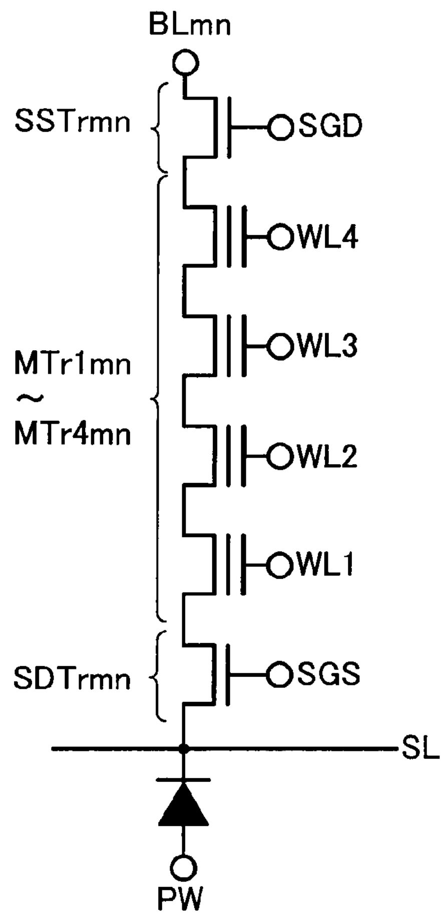
FIG. 3 is a circuit diagram illustrating one memory string MS according to the embodiment of the present invention.

A circuit configuration composed of the memory strings MS according to the embodiment and its operation are described below with reference to FIGS. 2 and 3. FIG. 3 is a circuit diagram illustrating one memory string MS according to the embodiment.

As shown in FIGS. 2 and 3, in the embodiment, the memory string MS has four memory transistors MTr1*mn* to MTr4*mn*. The four memory transistors MTr1*mn* to MTr4*mn*, the source side selecting transistor SSTrmn and the drain side selecting transistor SDTrmn are connected in series (see FIG. 3). In the memory string MS according to the embodiment, the pillar-shaped semiconductors CLmn are formed on an n+ area formed on a P-type area (P-well area) Ba1 on the semiconductor substrate Ba.

The source line SL (an n+ area formed on the P-well area Ba1 on the semiconductor substrate Ba) is connected to a source of the source side selecting transistor SSTrmn. The bit lines BL are connected to a drain of the drain side selecting transistor SDTrmn.

Each memory transistor MTrmn has the pillar-shaped semiconductors CLmn, the charge accumulating layer formed so as to surround the pillar-shaped semiconductors CLmn and the word lines WL formed so as to surround the chart accumulating layer. The word lines WL serve as control gate electrodes of the memory transistors MTrmn.

In the nonvolatile semiconductor storage device 100 having the above structure, voltages of the bit lines BL1 to BL3, the drain side selecting gate lines SGD, the word lines WL1 to WL4, the source side selecting gate line SGS and the source line SL are controlled by the bit line driving circuit (not shown), the drain side selecting gate line driving circuit 15, the word line driving circuit 13, the source side selecting gate line driving circuit 14 and the source line driving circuit (not shown). That is to say, charges of the charge accumulating layer of the predetermined memory transistor MTrmn are controlled so that data are written and erased.

(Concrete Structure of the Nonvolatile Semiconductor Storage Device 100 According to the Embodiment)

Figure 4:
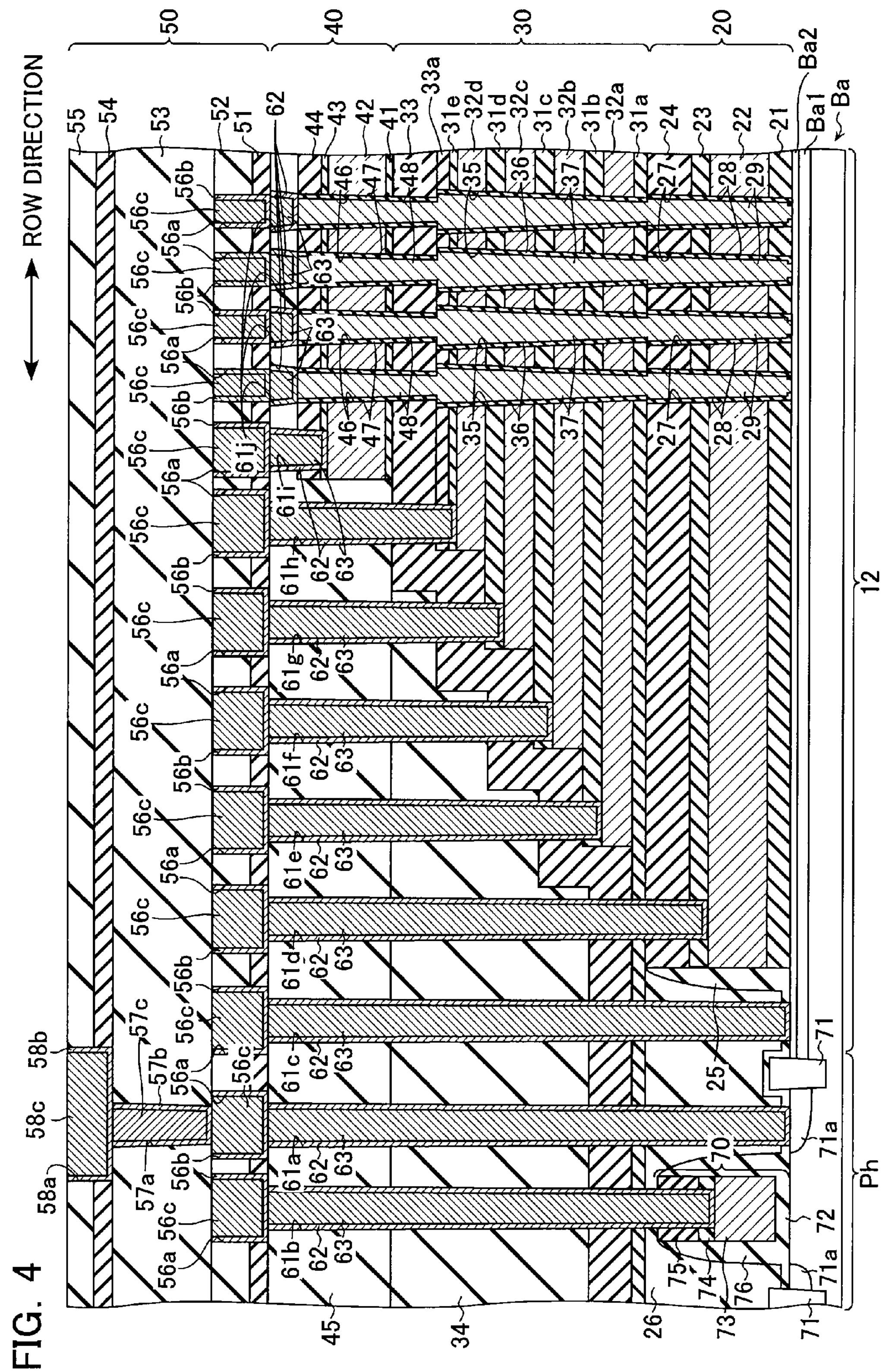
FIG. 4 is a cross-sectional view illustrating the nonvolatile semiconductor storage device according to the embodiment.

A concrete structure of the nonvolatile semiconductor storage device 100 is further described below with reference to FIG. 4. FIG. 4 is a cross-sectional view in the row direction illustrating the nonvolatile semiconductor storage device according to the embodiment. As shown in FIG. 4, the nonvolatile semiconductor storage device 100 (memory string MS) has a source side selecting transistor layer 20, a memory transistor layer 30, a drain side selecting transistor layer 40 and a wiring layer 50 which are arranged from a lower layer to an upper layer on the memory transistor area 12 on the semiconductor substrate Ba. The source side selecting transistor layer 20 serves as the source side selecting transistor SSTrmn. The memory transistor layer 30 serves as the memory transistors MTrmn. The drain side selecting transistor layer 40 serves as the drain side selecting transistor SDTrmn. The nonvolatile semiconductor storage device 100 has a peripheral transistor layer 70 on a peripheral area Ph around the memory transistor area 12 on the semiconductor substrate Ba.

The P-type area (P-well area) Ba1 is formed on the semiconductor substrate Ba. An n+ area (source line area) Ba2 is formed on the P-type area Ba1.

The source side selecting transistor layer 20 has a source side first insulating layer 21, a source side conductive layer 22, a source side second insulating layer 23 and a source side separation insulating layer 24 which are laminated sequentially on the semiconductor substrate Ba.

The source side first insulating layer 21, the source side conductive layer 22, the source side second insulating layer 23 and the source side separation insulating layer 24 are formed on the memory transistor area 12 so as to spread two dimensionally in the horizontal direction parallel with the semiconductor substrate Ba. The source side first insulating layer 21, the source side conductive layer 22, the source side second insulating layer 23 and the source side separation insulating layer 24 are divided for each predetermined area (erasing unit) on the memory transistor area 12, and a side wall insulating layer 25 is formed at their end portions in the row and column directions.

The source side first insulating layer 21 and the source side second insulating layer 23 are composed of silicon oxide ($SiO_2$). The source side conductive layer 22 is composed of P+type polysilicon (p-Si). The source side separation insulating layer 24 is composed of silicon nitride (SiN).

A source side hole 27 is formed so as to penetrate the source side separation insulating layer 24, the source side second insulating layer 23, the source side conductive layer 22 and the source side first insulating layer 21. A source side gate insulating layer 28 and a source side pillar-shaped portion 29 are provided sequentially on their side walls facing the source side holes 27. The source side pillar-shaped portion 29 is formed so as to contact with a lower surface of a memory pillar-shaped portion 37, described later, and extend downward. The source side pillar-shaped portion 29 is formed continuously to be integral with the memory pillar-shaped portion 37.

The source side gate insulating layer 28 is formed by silicon oxide ($SiO_2$). The source side pillar-shaped portion 29 is formed by polysilicon (p-Si).

In the structure of the source side selecting transistor 20, in other words, the source side conductive layer 22 is formed so as to sandwich the source side gate insulating layer 28 together with the source side pillar-shaped portion 29.

In the sources side selecting transistor layer 20, the source side conductive layer 22 serves as the source side selecting gate line SGS. The source side conductive layer 22 serves as a control gate of the source side selecting transistor SSTrmn.

The peripheral transistor layer 70 has a gate insulating layer 72, a gate conductive layer 73, a plug first insulating layer 74, a plug second insulating layer 75 and a side wall insulating layer 76. An element separation insulating layer 71 and a source/drain layer 71a are formed on the surface of the semiconductor substrate Ba formed with the peripheral transistor layer 70 with a predetermined pitch. The source/drain layer 71*a* is composed of an impurity which is implanted into the semiconductor substrate Ba. The peripheral transistor layer 70 is covered with an interlayer insulating layer 26.

The gate insulating layer 72 is formed on the semiconductor substrate Ba so as to straddle across the two source/drain layers 71*a*. The gate conductive layer 73 is formed on the gate insulating layer 72. The plug first insulating layer 74 is formed on the gate conductive layer 73. The plug second insulating layer 75 is formed on the plug first insulating layer 74. The side wall insulating layer 76 is formed so as to cover side walls of the gate insulating layer 72, the gate conductive layer 73, the plug first insulating layer 74 and the plug second insulating layer 75.

The gate insulating layer 72 is composed of oxide silicon ($SiO_2$). The gate conductive layer 73 is composed of N+type polysilicon (p-Si). The plug first insulating layer 74 is composed of silicon oxide ($SiO_2$). The plug second insulating layer 75 is composed of silicon nitride (SiN). The side wall insulating layer 76 and the interlayer insulating layer 26 are composed of silicon oxide ($SiO_2$).

The memory transistor layer 30 has first to fifth word interline insulating layers 31*a* to 31*e*, first to fourth word line conductive layers 32*a* to 32*d*, a memory separation insulating layer 33*a* and a memory protection insulating layer 33. The first to fifth word interline insulating layers 31*a* to 31*e* are provided above the source side separation insulating layer 24 and the interlayer insulating layer 25. The first to fourth word line conductive layers 32*a* to 32*d* are provided between the first to fifth word interline insulating layers 31*a* to 31*e*, respectively. The memory separation insulating layer 33*a* and the memory protection insulating layer 33 are laminated sequentially on the fifth word interline insulating layer 31*e*.

The first to fifth word interline insulating layers 31*a* to 31*e*, the first to fourth word line conductive layers 32*a* to 32*d* and the memory separation insulating layer 33*a* are formed so as to spread two dimensionally in the row and column directions. Further, their end portions in the row direction are formed into a staircase pattern. The memory protection insulating layer 33 is formed so as to cover the end portions in the row direction and the end portions in the column direction of the first to fifth word interline insulating layers 31*a* to 31*e*, the first to fourth word line conductive layers 32*a* to 32*d* and the memory separation insulating layer 33*a*. In the memory transistor layer 30, an interlayer insulating layer 34 is formed so as to cover the upper portion of the memory protection insulating layer 33 formed on the upper surface of the first word interline insulating layer 31*a* through the upper portion of the memory protection insulating layer 33 formed on the upper surface of the memory separation insulating layer 33*a*.

The first to fifth word interline insulating layers 31*a* to 31*e* are composed of silicon oxide ($SiO_2$). The first to fourth word line conductive layers 32*a* to 32*d* are composed of P+type polysilicon (p-Si). The memory separation insulating layer 33*a* and the memory protection insulating layer 33 are composed of silicon nitride (SiN). The interlayer insulating layer 34 is composed of silicon oxide ($SiO_2$).

In the memory transistor layer 30, memory holes 35 are formed so as to penetrate the memory separation insulating layer 33*a*, the first to fifth word interline insulating layers 31*a* to 31*e* and the first to fourth word line conductive layers 32*a* to 32*d*. The memory holes 35 are provided on positions which match with the source side holes 27. A memory gate insulating layer 36 and a memory pillar-shaped portion 37 are provided sequentially on side walls in the memory holes 35.

Figure 5:
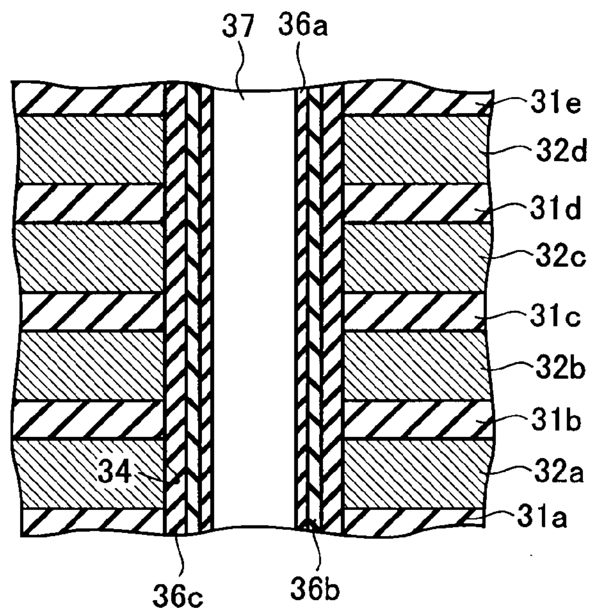
FIG. 5 is a partially enlarged diagram of FIG. 4.

The memory gate insulating layer 36 is constituted as shown in FIG. 5. FIG. 5 is an enlarged diagram illustrating the memory transistor layer 30 shown in FIG. 4. As shown in FIG. 5, the memory gate insulating layer 36 has a tunnel insulating layer 36*a*, a charge accumulating layer 36*b* which accumulates charges, and a block insulating layer 36*c* which are arranged in this order on the side wall of the memory pillar-shaped portion 37. The memory pillar-shaped portion 37 is formed so as to extend to a direction vertical to the substrate. The memory pillar-shaped portion 37 is formed continuously to be integral with the source side pillar-shaped portion 29 and a drain side pillar-shaped portion 48, described later.

The tunnel insulating layer 36*a* and the block insulating layer 36*c* are formed by silicon oxide ($SiO_2$). The charge accumulating layer 36*b* is formed by silicon nitride (SiN). The memory pillar-shaped portion 37 is composed of polysilicon (p-Si). An upper portion of the memory pillar-shaped portion 37 may be composed of N+type polysilicon.

In the memory transistor 30, in other words, the first to fourth word line conductive layers 32*a* to 32*d* are formed so as to sandwich the tunnel insulating layer 36*a*, the charge accumulating layer 36*b* and the block insulating layer 36*c* together with the memory pillar-shaped portion 37.

In the memory transistor layer 30, the first to fourth word line conductive layers 32*a* to 32*d* serve as the word lines WL1 to WL4. The first to fourth word line conductive layers 32*a* to 32*d* serve as control gates of the memory transistors MTrmn.

The drain side selecting transistor layer 40 has a drain side first insulating layer 41, a drain side conductive layer 42, a drain side second insulating layer 43 and a drain side separation insulating layer 44 which are laminated sequentially on the memory protection insulating layer 33.

The drain side first insulating layer 41, the drain side conductive layer 42, the drain side second insulating layer 43 and the drain side separation insulating layer 44 are formed into a line pattern on positions which match with the upper portions of the memory pillar-shaped portions 37. They extend to the row direction, and are provided repeatedly in the column direction. In the drain side selecting transistor layer 40, an interlayer insulating layer 45 is formed on the upper surface of the interlayer insulating layer 34 so as to be at a predetermined height from the upper surface of the drain side separation insulating layer 44.

The drain side first insulating layer 41 and the drain side second insulating layer 43 are formed by silicon oxide ($SiO_2$). The drain side conductive layer 42 is formed by P+type polysilicon (p-Si). The drain side separation insulating layer 44 is formed by silicon nitride (SiN). The interlayer insulating layer 45 is formed by silicon oxide ($SiO_2$).

In the drain side selection transistor layer 40, a drain side hole 46 is formed so as to penetrate the drain side separation insulating layer 44, the drain side second insulating layer 43, the drain side conductive layer 42, the drain side first insulating layer 41 and the memory protection insulating layer 33. The drain side hole 46 is provided on positions which match with the memory holes 35. A drain side gate insulating layer 47 and a drain side pillar-shaped portion 48 are provided sequentially on side walls facing the drain side holes 46. The drain side pillar-shaped portion 48 is formed so as to contact with the upper surface of the memory pillar-shaped portion 37 and extend upward. The drain side pillar-shaped portion 48 is formed continuously to be integral with the memory pillar-shaped portion 37.

The drain side gate insulating layer 47 is formed by silicon oxide ($SiO_2$). The drain side pillar-shaped portion 48 is formed by polysilicon (p-Si). An upper portion of the drain side pillar-shaped portion 48 is composed of N+type polysilicon.

In the structure of the drain side selecting transistor 40, in other words, the drain side conductive layer 42 is formed so as to sandwich the drain side gate insulating layer 47 together with the drain side pillar-shaped portion 48.

In the drain side selecting transistor 40, the drain side conductive layers 42 serve as the drain side selecting gate lines SGD. The drain side conductive layer 42 serve as a control gate of the drain side selecting transistor SDTrmn.

The drain side pillar-shaped portion 48, the memory pillar-shaped portion 37 and the source side pillar-shaped portion 29 are composed of the same layer (pillar-shaped semiconductor layer) formed integrally. That is to say, an interface is not formed between the drain side pillar-shaped portion 48, the memory pillar-shaped portion 37 and the source side pillar-shaped portion 29, and a natural oxide layer is not formed therebetween.

Plug holes 61*a* to 61*j* are formed on the source side selecting transistor layer 20, the memory transistor layer 30 and the drain side selecting transistor layer 40.

The plug hole 61*a* is formed so as to reach a source/drain layer 71*a*. That is to say, the plug hole 61*a* is formed so as to penetrate the interlayer insulating layer 45, the interlayer insulating layer 34, the memory protection insulating layer 33, the first word interline insulating layer 31*a* and the interlayer insulating layer 26.

The plug hole 61*b* is formed so as to reach the upper surface of the gate conductive layer 73. That is to say, the plug hole 61*b* is formed so as to penetrate the interlayer insulating layer 45, the interlayer insulating layer 34, the memory protection insulating layer 33, the first word interline insulating layer 31*a*, the interlayer insulating layer 26, the plug second insulating layer 75 and the plug first insulating layer 74.

The plug hole 61*c* is formed so as to reach the n+ area Ba2. That is to say, the plug hole 61*c* is formed so as to penetrate the interlayer insulating layer 45, the interlayer insulating layer 34, the memory protection insulating layer 33, the first word interline insulating layer 31*a* and the interlayer insulating layer 26.

The plug hole 61*d* is formed so as to reach the upper surface of the source side conductive layer 22. That is to say, the plug hole 61*d* is formed so as to penetrate the interlayer insulating layer 45, the interlayer insulating layer 34, the memory protection insulating layer 33, the first word interline insulating layer 31*a*, the source side separation insulating layer 24 and the source side second insulating layer 23.

The plug holes 61*e* to 61*h* are formed so as to reach the upper surfaces of the first to fourth word line conductive layers 32*a* to 32*d*. That is to say, the plug hole 61*e* is formed so as to penetrate the interlayer insulating layer 45, the interlayer insulating layer 34, the memory protection insulating layer 33, and the second word interline insulating layer 31*b*. The plug hole 61*f* is formed so as to penetrate the interlayer insulating layer 45, the interlayer insulating layer 34, the memory protection insulating layer 33 and the third word interline insulating layer 31*c*. The plug hole 61*g* is formed so as to penetrate the interlayer insulating layer 45, the interlayer insulating layer 34, the memory protection insulating layer 33, and the fourth word interline insulating layer 31*d*. The plug hole 61*h* is formed so as to penetrate the interlayer insulating layer 45, the interlayer insulating layer 34, the memory protection insulating layer 33, the memory separation insulating layer 33*a* and the fifth word interline insulating layer 31*e*.

The plug hole 61*i* is formed so as to reach the upper surface of the drain side conductive layer 42. That is to say, the plug hole 61*i* is formed so as to penetrate the interlayer insulating layer 45, the drain side separation insulating layer 44 and the drain side second insulating layer 43.

The plug hole 61*j* is formed so as to reach the drain side pillar-shaped portion 48. That is to say, the plug hole 61*j* is formed so as to penetrate the interlayer insulating layer 45.

A barrier metal layer 62 and a plug conductive layer 63 are formed sequentially on side walls facing the plug holes 61*a* to 61*j*. The barrier metal layer 62 is composed of titanium-titanium nitride (Ti—TiN). The plug conductive layer 63 is composed of tungsten (W).

A wiring layer 50 has wiring first to fifth insulating layers 51 to 55 which are laminated sequentially on the upper surface of the interlayer insulating layer 45. The wiring first insulating layer 51 and the wiring fourth insulating layer 54 are composed of silicon nitride (SiN). The wiring second insulating layer 52, the wiring third insulating layer 53 and the wiring fifth insulating layer 55 are composed of silicon oxide ($SiO_2$).

The wiring layer 50 has a wiring first groove 56*a*, a wiring plug hole 57*a* and a wiring second groove 58*a*.

The wiring first groove 56*a* is formed so as to penetrate the wiring first insulating layer 51 and the wiring second insulating layer 52. The wiring first groove 56*a* is provided on positions which match with the plug holes 61*a* to 61*j*.

A barrier metal layer 56*b* and a wiring first conductive layer 56*c* are formed sequentially on side walls facing the wiring first grooves 56*a*. The barrier metal layer 56*b* is composed of titanium-titanium nitride (Ti—TiN). The wiring first conductive layer 56*c* is composed of tungsten (W).

The wiring plug hole 57*a* is formed so as to penetrate the third wiring insulating layer 53. The wiring plug hole 57*a* is formed on positions which match with the wiring first grooves 56*a*.

A barrier metal layer 57*b* and a wiring plug conductive layer 57*c* are formed sequentially on a side wall facing the wiring plug hole 57*a*. The barrier metal layer 57*b* is composed of titanium-titanium nitride (Ti—TiN). The wiring plug conductive layer 57*c* is composed of tungsten (W).

A wiring second groove 58*a* is formed so as to penetrate the wiring fifth insulating layer 55 and the wiring fourth insulating layer 54. The wiring second groove 58*a* is provided on a position which matches with the wiring plug hole 57*a*.

A barrier metal layer 58*b* and a wiring second conductive layer 58*c* are formed sequentially on the side wall facing the wiring second groove 58*a*. The barrier metal layer 58*b* is composed of titanium-titanium nitride (Ti—TiN). The wiring second conductive layer 58*c* is composed of tungsten (W).

(Steps of Manufacturing the Nonvolatile Semiconductor Storage Device 100 According to the Embodiment)

Manufacturing steps of the nonvolatile semiconductor storage device 100 according to the embodiment is described below with reference to FIGS. 6 to 22.

Figure 6:
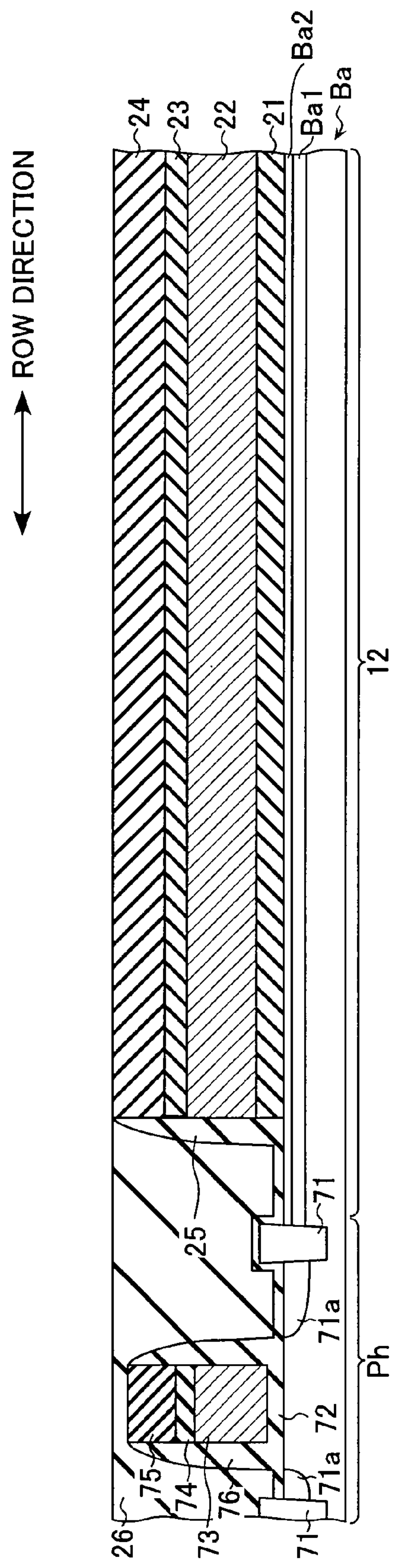
FIG. 6 is a cross-sectional view illustrating a manufacturing step of the nonvolatile semiconductor storage device according to the embodiment.

As shown in FIG. 6, the P-well area Ba1, the n+ area Ba2 and an element separating area 71 are formed on the semiconductor substrate Ba by lithography, ion implantation and dry etching. Silicon oxide ($SiO_2$), polysilicon (p-Si), and silicon nitride (SiN) are laminated sequentially, and lithography, dry etching and ion implantation are carried out. The source side first insulating layer 21, the source side conductive layer 22, the source side second insulating layer 23 and the source side separation insulating layer 24 are formed on the memory transistor area 12 by the above steps. The peripheral transistor layer 70 is formed on a peripheral area Ph and at the end portion of the memory transistor area 12. Silicon oxide ($SiO_2$) is deposited and Chemical Mechanical Polishing treatment (CMP) is given so that the interlayer insulating layer 26 is formed.

Figure 7:
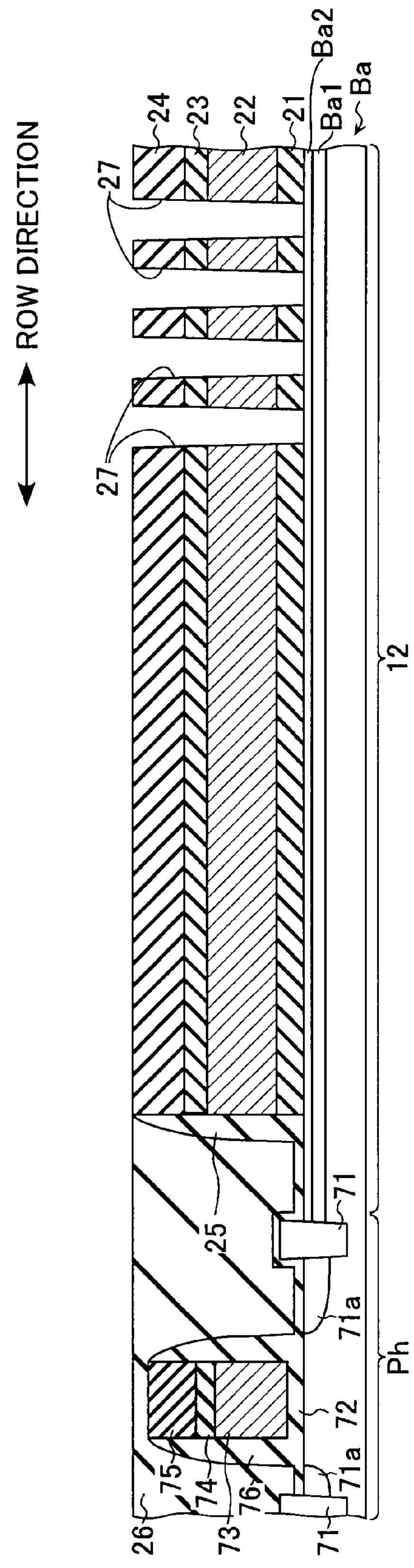
FIG. 7 is a cross-sectional view illustrating a manufacturing step of the nonvolatile semiconductor storage device according to the embodiment.

As shown in FIG. 7, the source side holes 27 are formed on the n+ area Ba2 with a predetermined pitch so as to penetrate the source side separation insulating layer 24, the source side second insulating layer 23, the source side conductive layer 22 and the source side first insulating layer 21.

Figure 8:
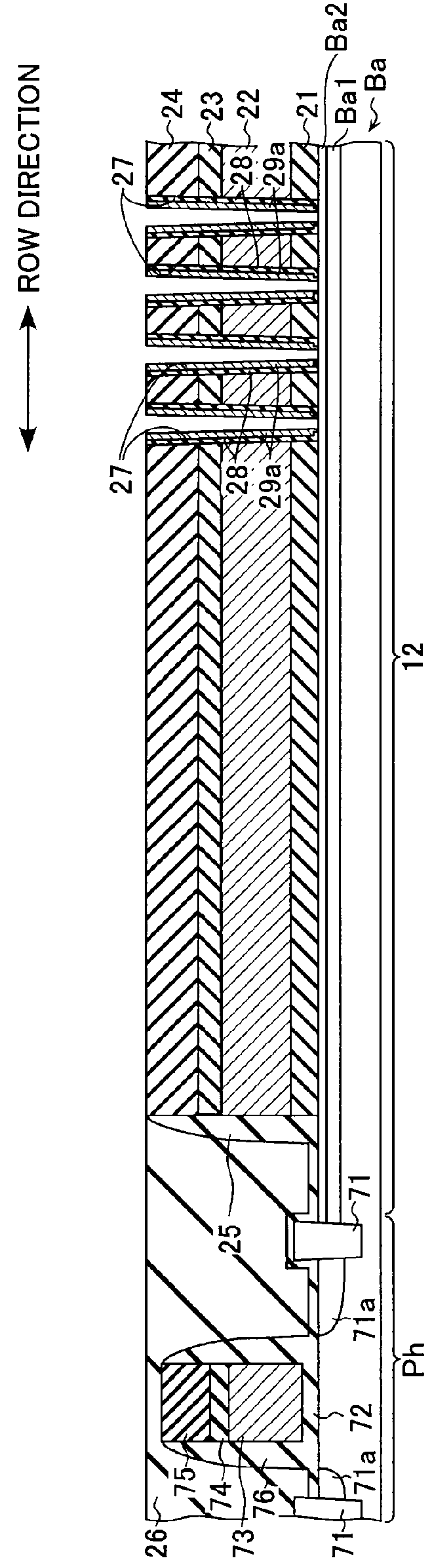
FIG. 8 is a cross-sectional view illustrating a manufacturing step of the nonvolatile semiconductor storage device according to the embodiment.

As shown in FIG. 8, silicon oxide ($SiO_2$) and amorphous silicon (a-Si) are deposited on the source side holes 27. The silicon oxide ($SiO_2$) formed on bottom portions of the source side holes 27 and the amorphous silicon (a-Si) are removed by Reactive Ion Etching (RIE). The source side gate insulating layer 28 and a spacer layer 29*a* are formed sequentially on the side walls facing the source side holes 27 by the above steps. Thereafter, the bottom portions of the source side holes 27 are subject to dilute hydrofluoric acid treatment so that the natural oxide film is removed.

Figure 9:
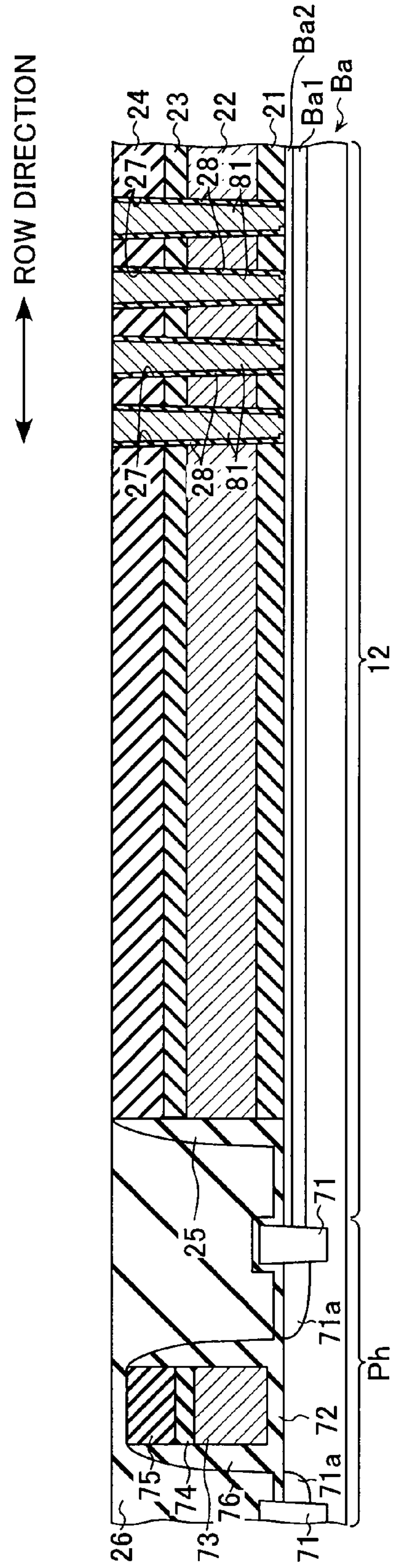
FIG. 9 is a cross-sectional view illustrating a manufacturing step of the nonvolatile semiconductor storage device according to the embodiment.

As shown in FIG. 9, after amorphous silicon (a-Si) is deposited so as to infill the source side holes 27, RIE treatment and heat treatment are executed. A source side sacrificing layer 81 is formed so as to contact with the source side gate insulating layer 28 in the source side holes 27 at the above step. The source side sacrificing layer 81 is removed at a later step.

Figure 10:
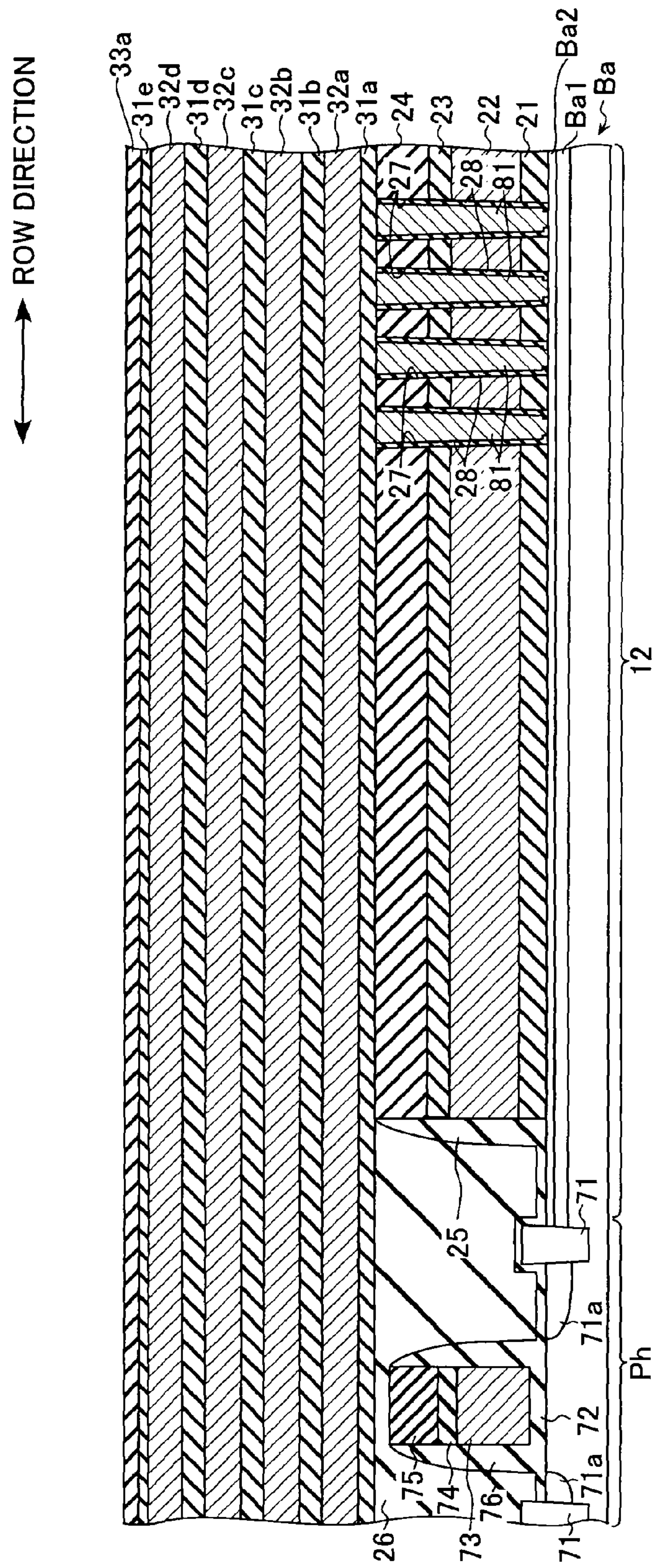
FIG. 10 is a cross-sectional view illustrating a manufacturing step of the nonvolatile semiconductor storage device according to the embodiment.

As shown in FIG. 10, silicon oxide ($SiO_2$) and the P+type polysilicon (p-Si) are laminated alternatively on the source side separation insulating layer 24 and the interlayer insulating layer 26. Thereafter, silicon nitride (SiN) is deposited thereon so that the first to fifth word interline insulating layers 31*a* to 31*e*, the first to fourth word line conductive layers 32*a* to 32*d* and the memory separation insulating layer 33*a* are formed.

Figure 11:
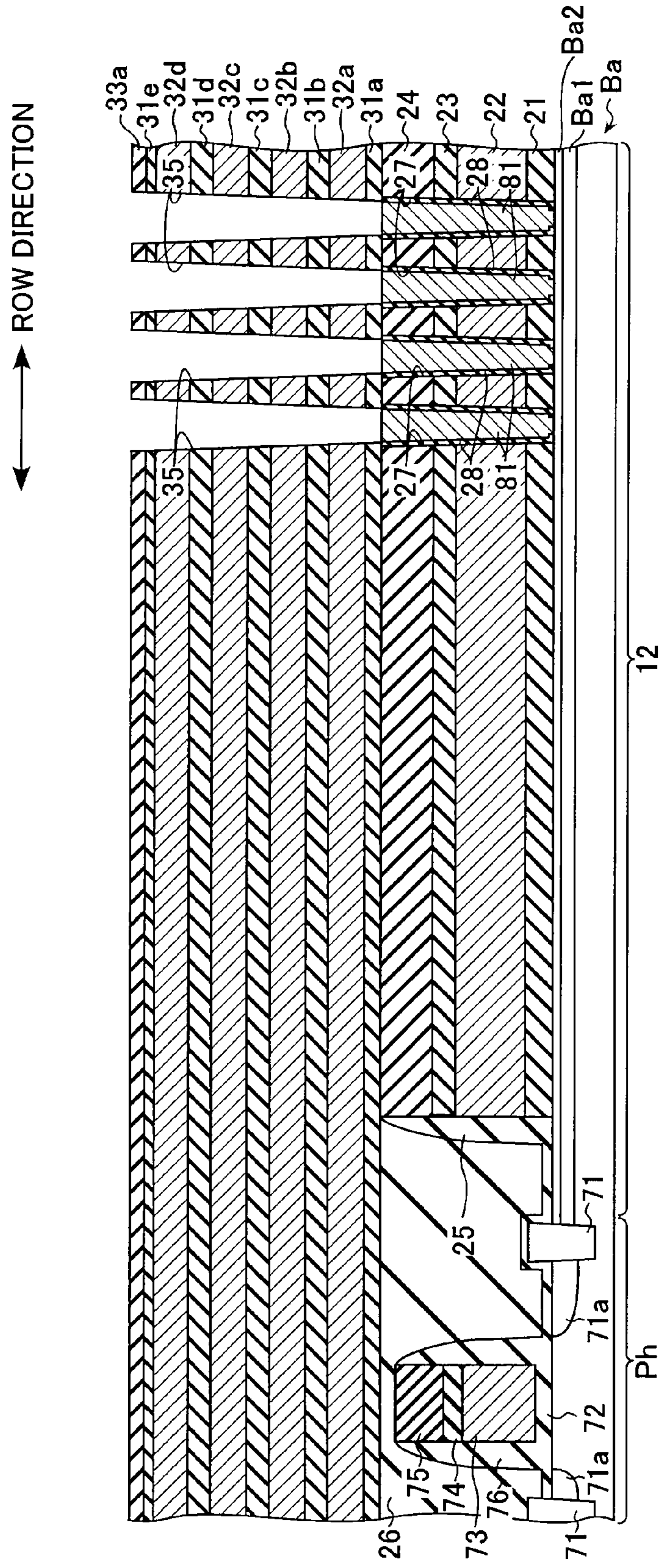
FIG. 11 is a cross-sectional view illustrating a manufacturing step of the nonvolatile semiconductor storage device according to the embodiment.

As shown in FIG. 11, the memory hole 35 is formed on the positions which match with the source side holes 27 so as to penetrate the memory separation insulating layer 33*a*, the first to fifth word interline insulating layers 31*a* to 31*e* and the first to fourth word line conductive layers 32*a* to 32*d*.

Figure 12:
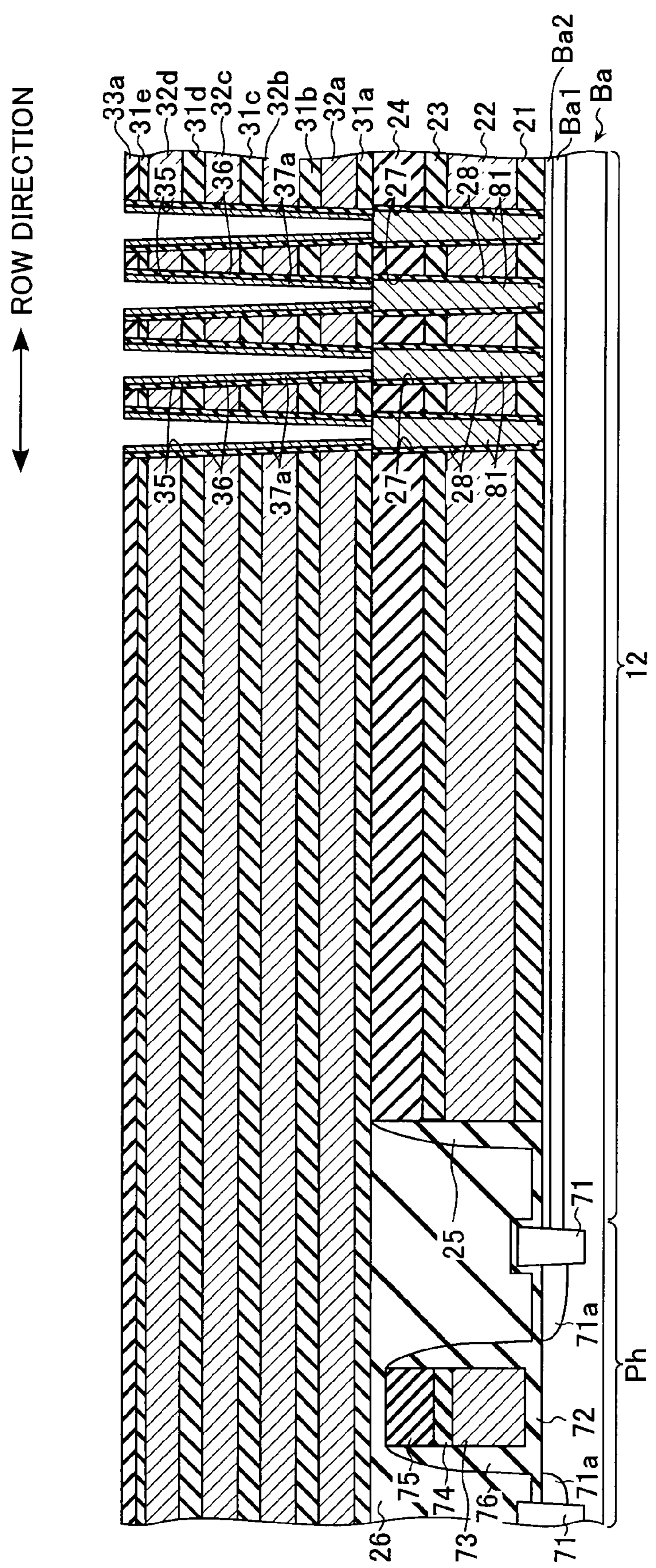
FIG. 12 is a cross-sectional view illustrating a manufacturing step of the nonvolatile semiconductor storage device according to the embodiment.

As shown in FIG. 12, silicon oxide ($SiO_2$), silicon nitride (SiN), silicon oxide ($SiO_2$) and amorphous silicon (a-Si) are laminated sequentially in the memory holes 35, and these portions are subject to the RIE treatment. The memory gate insulating layer 36 (36*a*, 36*b* and 36*c*) and the spacer layer 37*a* are formed on the side walls facing the memory holes 35 at the above step. The bottom portions of the memory holes 35 are subject to dilute hydrofluoric acid treatment so that the natural oxide films is removed.

Figure 13:
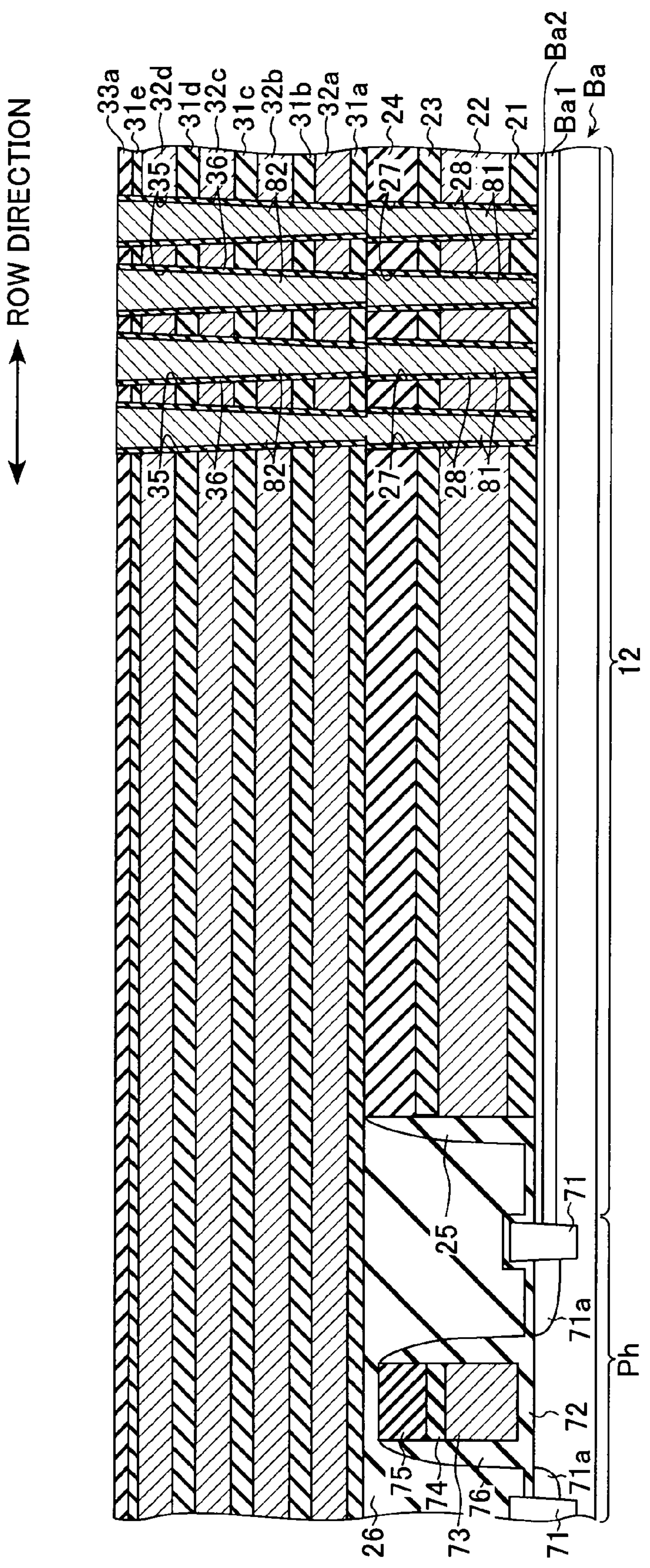
FIG. 13 is a cross-sectional view illustrating a manufacturing step of the nonvolatile semiconductor storage device according to the embodiment.

As shown in FIG. 13, after amorphous silicon (a-Si) is deposited so as to infill the memory holes 35, these portions are subject to the RIE treatment and the heat treatment. A memory sacrificing layer 82 is formed so as to contact with the memory gate insulating layer 36 in the memory holes 35 at the above steps. The memory sacrificing layer 82 is removed by a later step.

Figure 14:
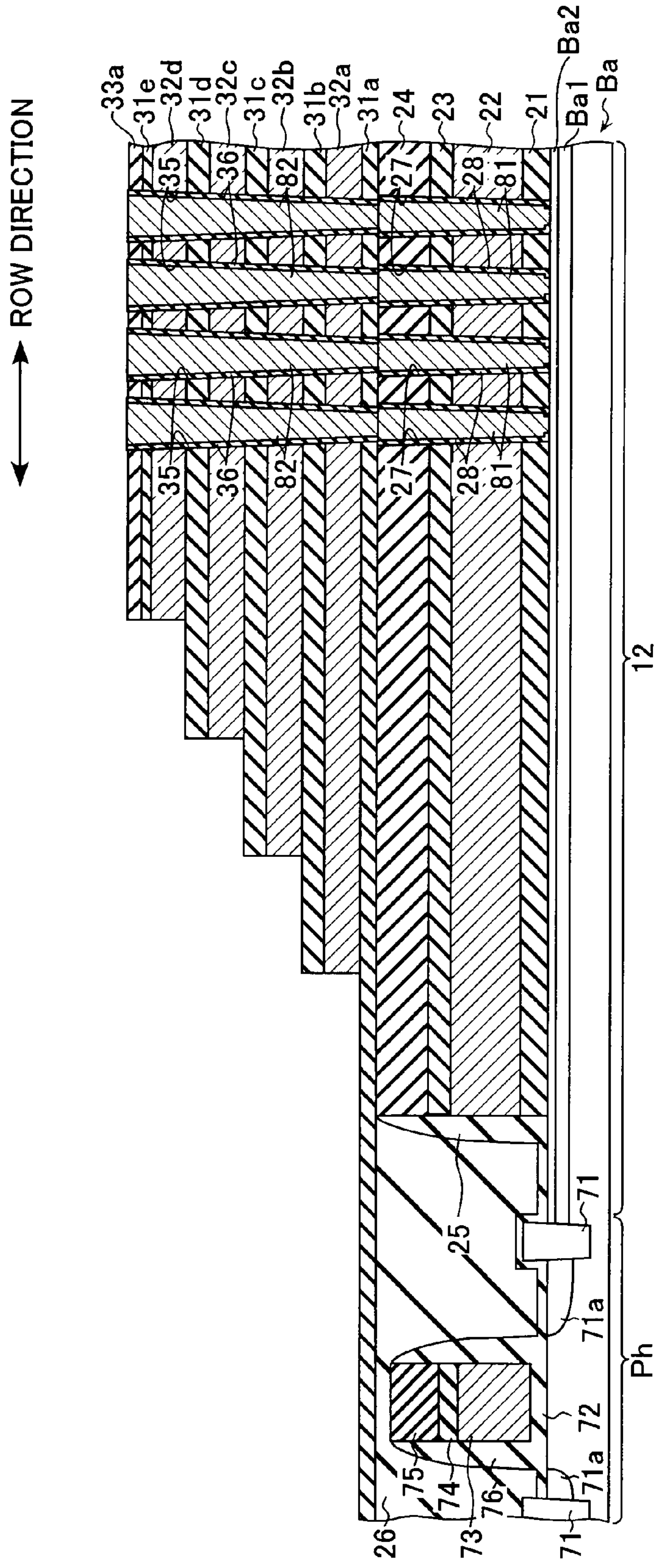
FIG. 14 is a cross-sectional view illustrating a manufacturing step of the nonvolatile semiconductor storage device according to the embodiment.

As shown in FIG. 14, the end portion of the memory transistor layer 30 in the row direction is processed into a staircase pattern.

Figure 15:
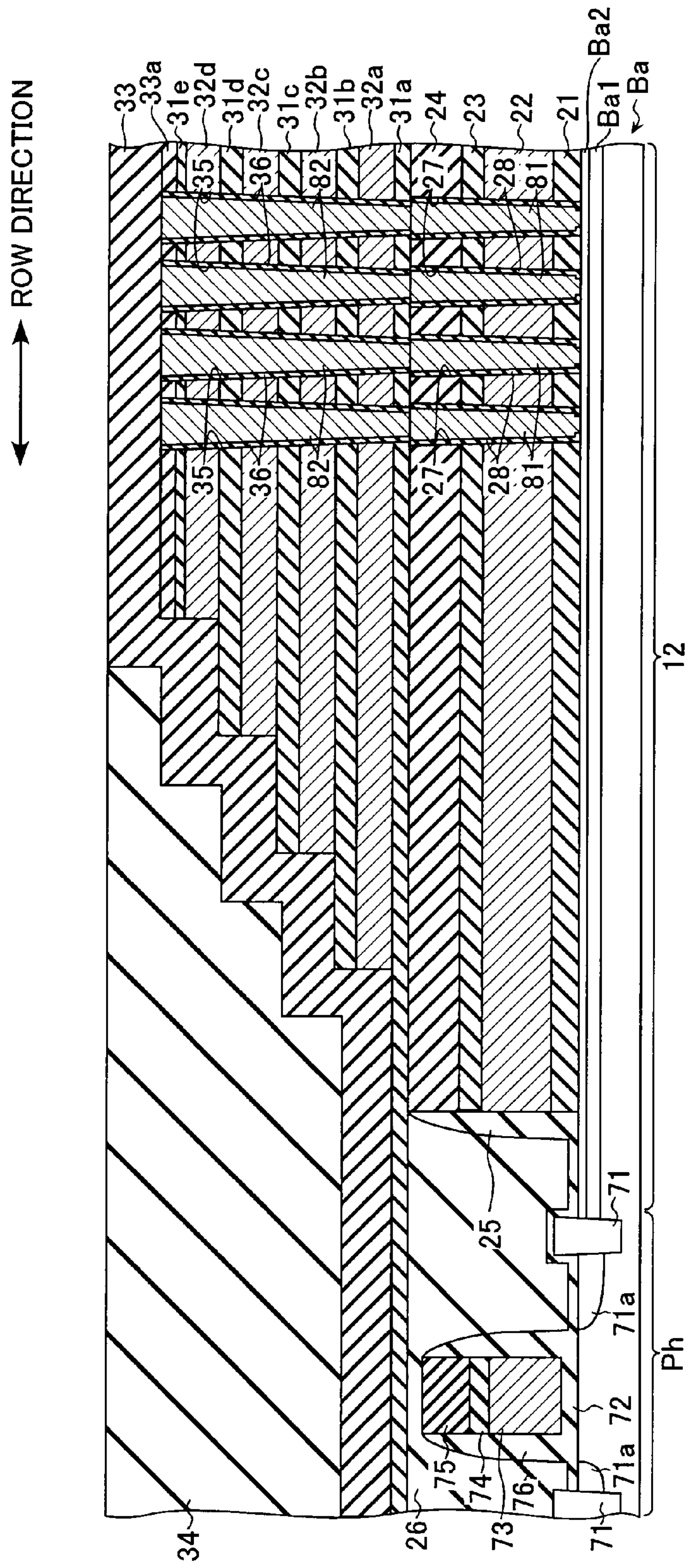
FIG. 15 is a cross-sectional view illustrating a manufacturing step of the nonvolatile semiconductor storage device according to the embodiment.

As shown in FIG. 15, after silicon nitride (SiN) and silicon oxide ($SiO_2$) are deposited, the deposited portions are subject to CMP treatment. The memory protection insulating layer 33 and the interlayer insulating layer 34 are formed at the above steps.

Figure 16:
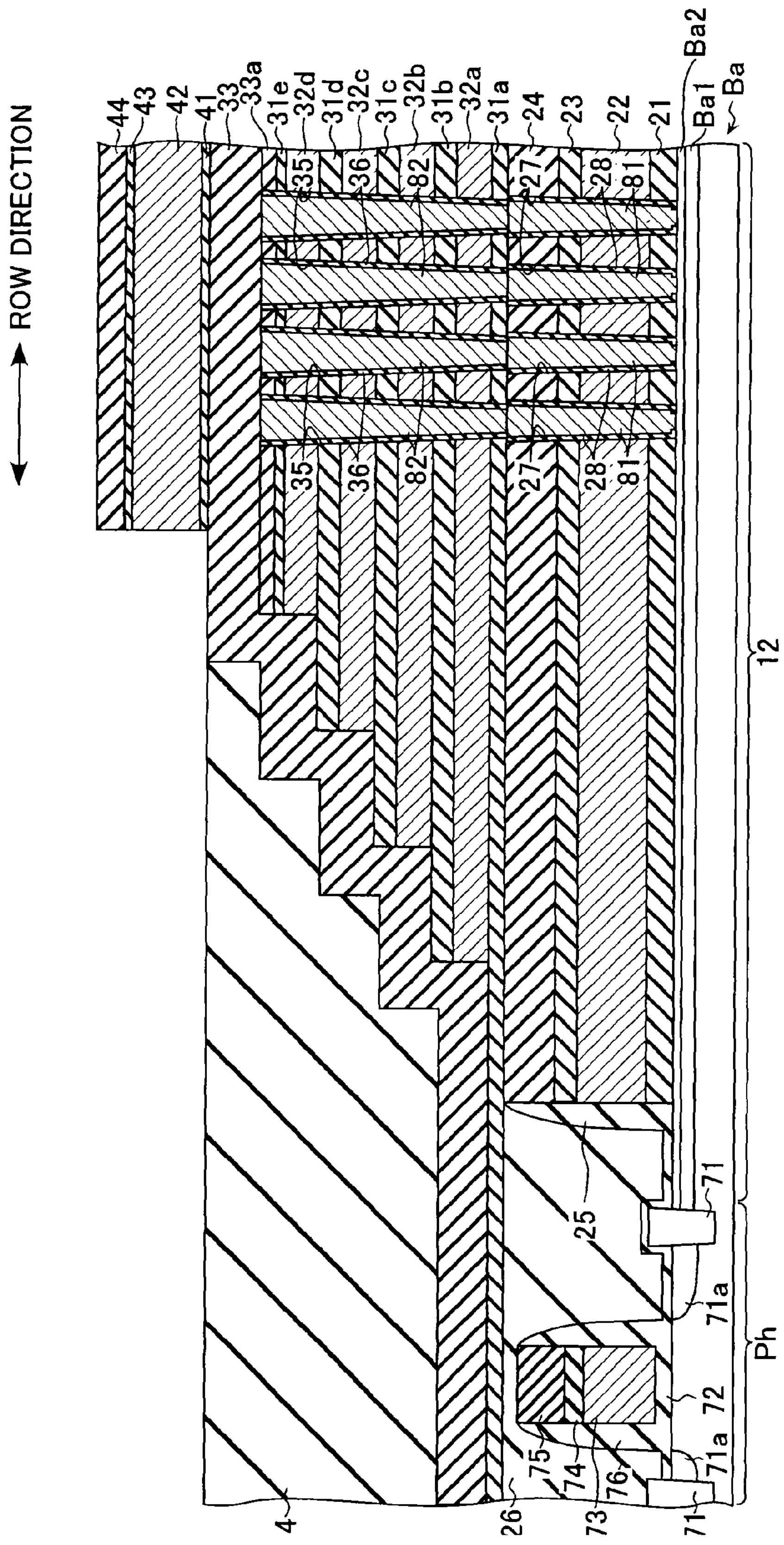
FIG. 16 is a cross-sectional view illustrating a manufacturing step of the nonvolatile semiconductor storage device according to the embodiment.

As shown in FIG. 16, silicon oxide ($SiO_2$), P+type polysilicon (p-Si), silicon oxide ($SiO_2$) and silicon nitride (SiN) are deposited on the memory protection insulating layer 33. The deposited portion is subject to lithography and dry etching, so that the drain side first insulating layer 41, the drain side conductive layer 42, the drain side second insulating layer 43 and the drain side separation insulating layer 44 are formed.

Figure 17:
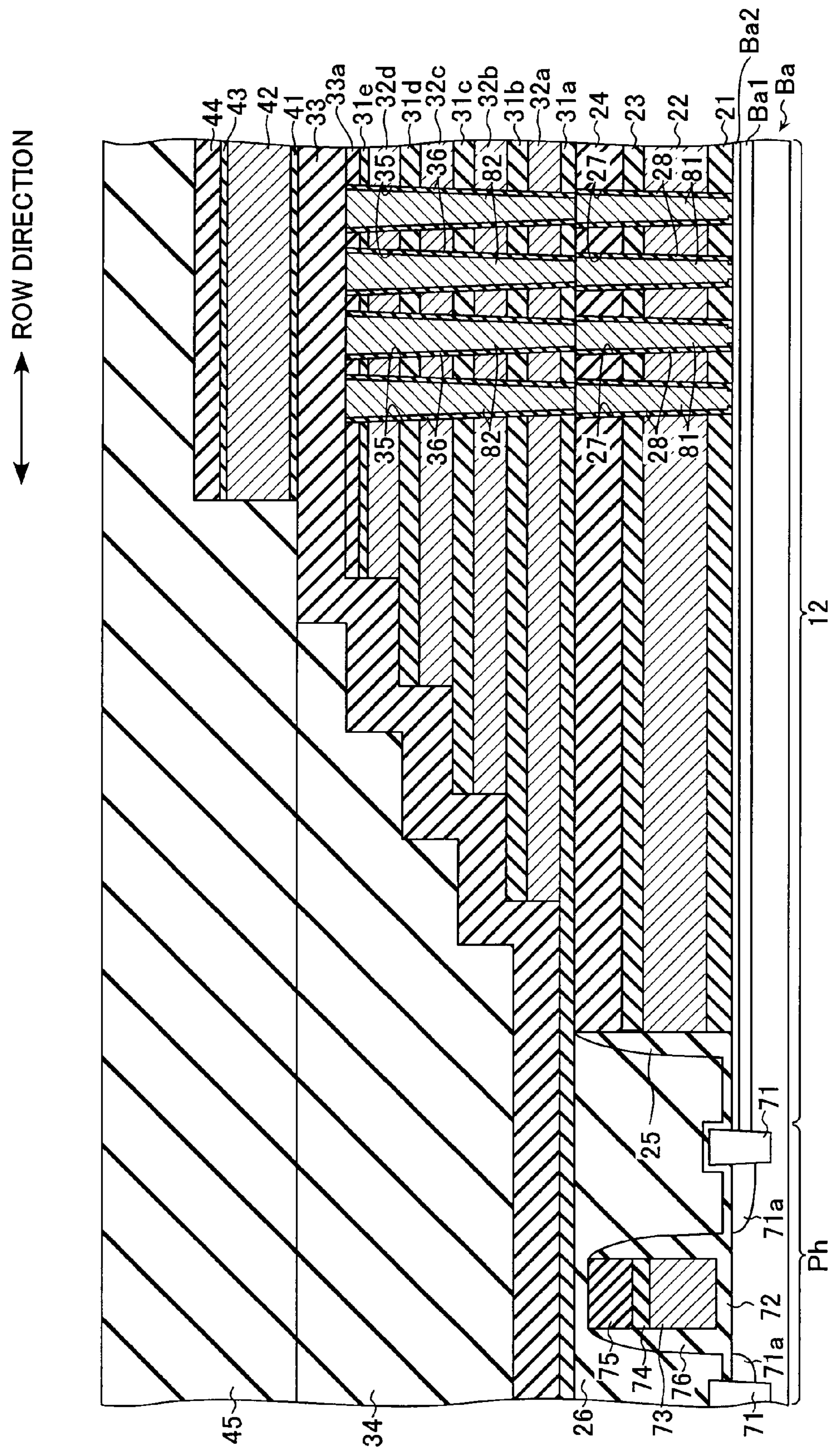
FIG. 17 is a cross-sectional view illustrating a manufacturing step of the nonvolatile semiconductor storage device according to the embodiment.

As shown in FIG. 17, silicon oxide ($SiO_2$) is deposited on the upper surface of the drain side separation insulating layer 44 up to a predetermined height. Thereafter, the deposited portion is flattened by CMP treatment so that the interlayer insulating layer 45 is formed.

Figure 18:
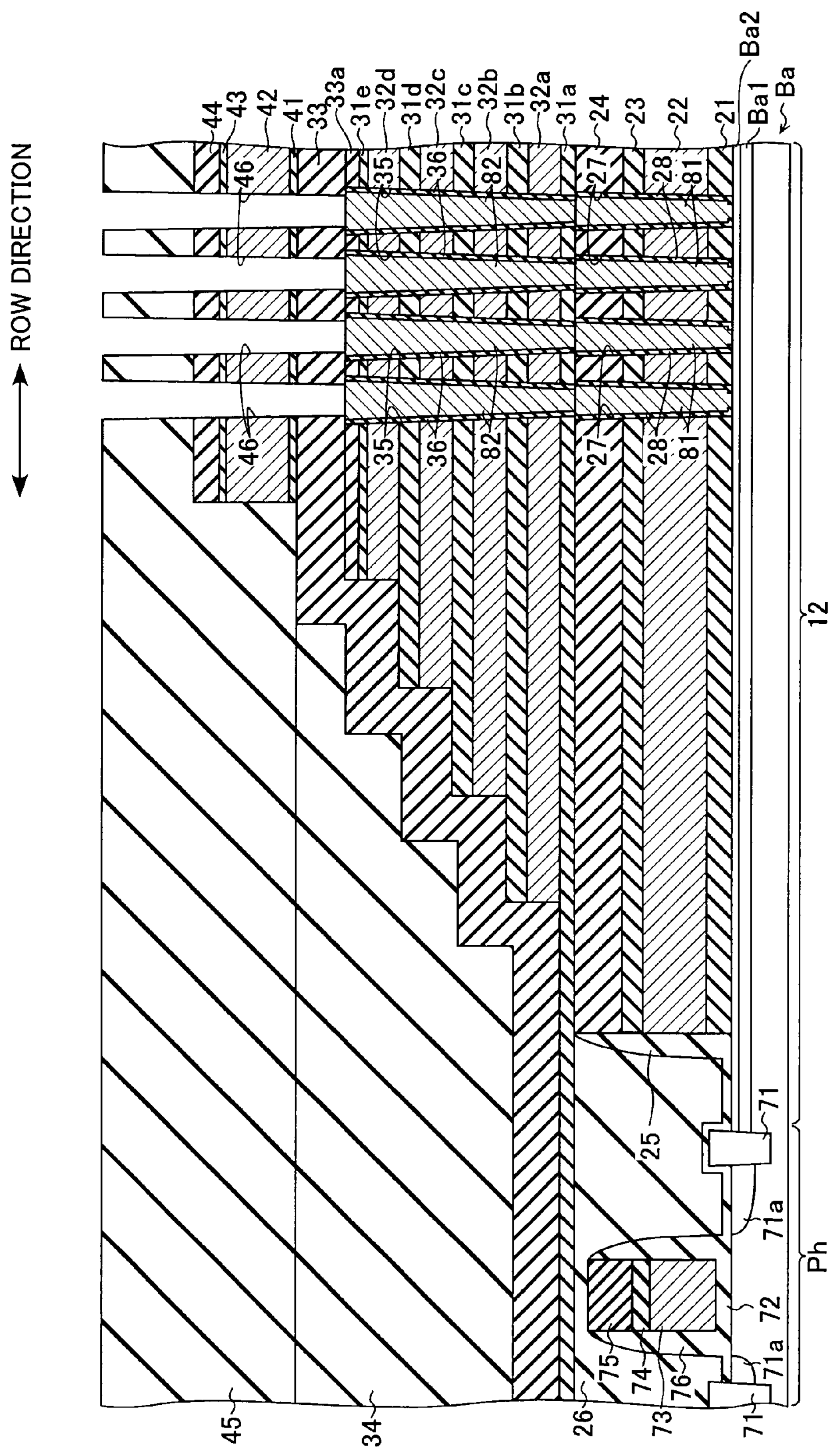
FIG. 18 is a cross-sectional view illustrating a manufacturing step of the nonvolatile semiconductor storage device according to the embodiment.

As shown in FIG. 18, the drain side holes 46 are formed so as to penetrate the interlayer insulating layer 45, the drain side separation insulating layer 44, the drain side second insulating layer 43, the drain side conductive layer 42, the drain side first insulating layer 41 and the memory protection insulating layer 33. The drain side hole 46 is formed on the positions which match with the memory holes 35.

Figure 19:
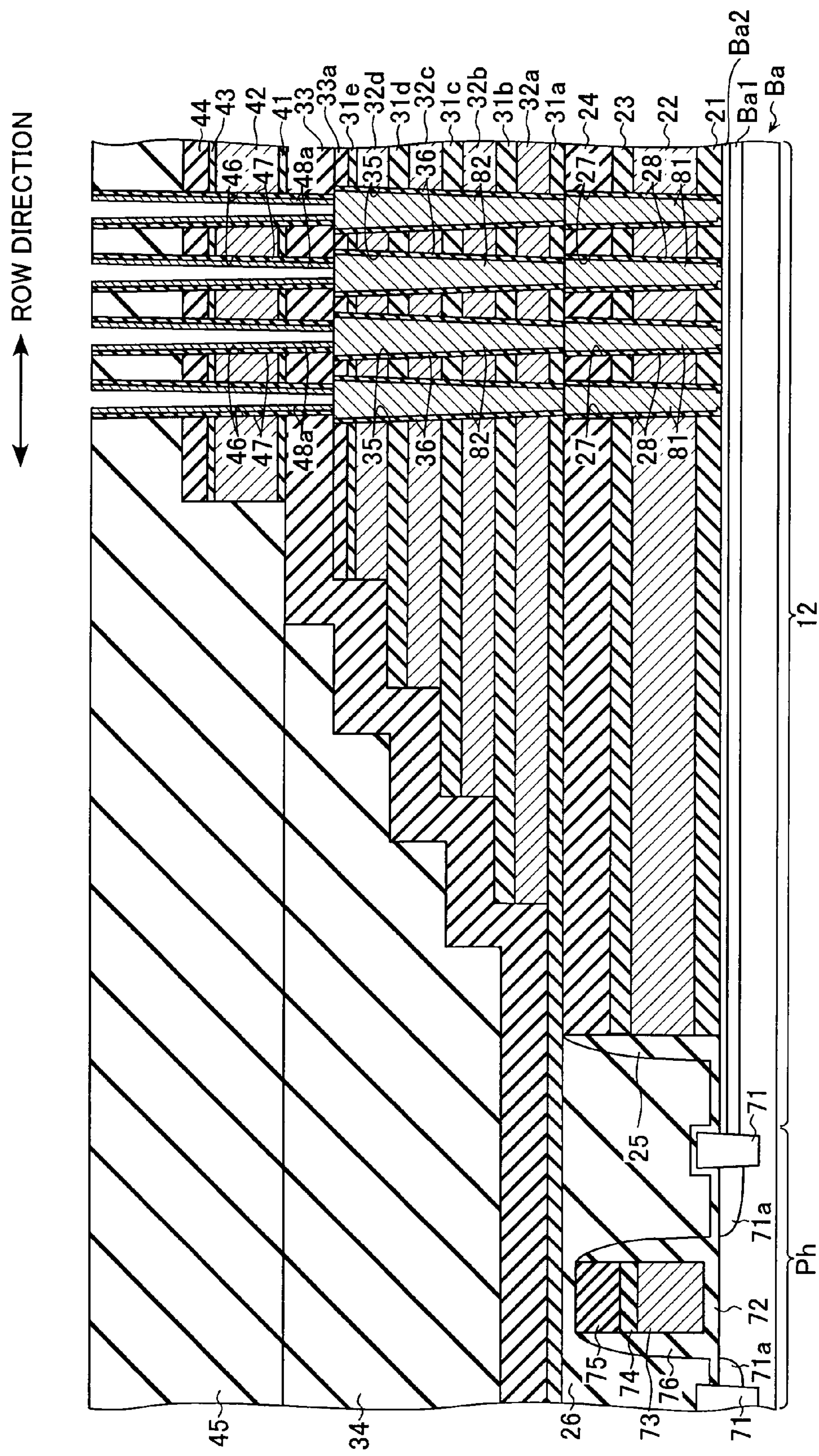
FIG. 19 is a cross-sectional view illustrating a manufacturing step of the nonvolatile semiconductor storage device according to the embodiment.

As shown in FIG. 19, silicon oxide ($SiO_2$) and amorphous silicon (a-Si) are deposited on the drain side holes 46. The silicon oxide ($SiO_2$) and the amorphous silicon (a-Si) formed on the bottom portions of the drain side holes 46 are removed by RIE. The drain side gate insulating layer 47 and a spacer layer 48*a* are formed on the side walls facing the drain side holes 46 by the above steps. Thereafter, the bottom portions of the drain side holes 46 are subject to the dilute hydrofluoric acid treatment so that the natural oxide film is removed.

Figure 20:
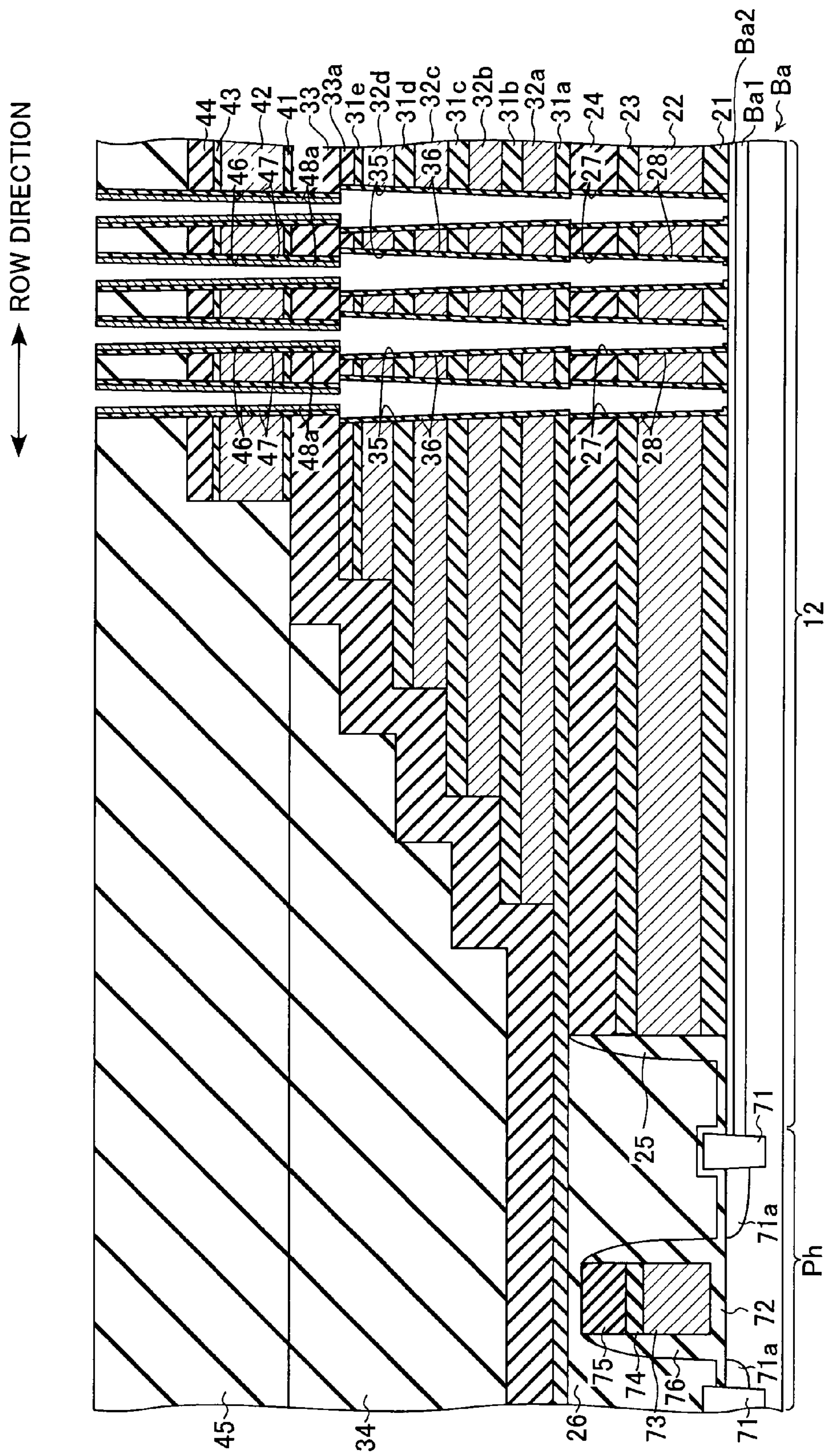
FIG. 20 is a cross-sectional view illustrating a manufacturing step of the nonvolatile semiconductor storage device according to the embodiment.

As shown in FIG. 20, the memory sacrificing layer 82 and the source side sacrificing layer 81 are selectively removed via the drain side holes 46. Since the memory sacrificing layer 82 and the source side sacrificing layer 81 are composed of amorphous silicon, they are selectively removed by using Choline, for example. A cavity where the drain side hole 46, the memory hole 35 and the source side hole 27 continue is formed by this step.

Figure 21:
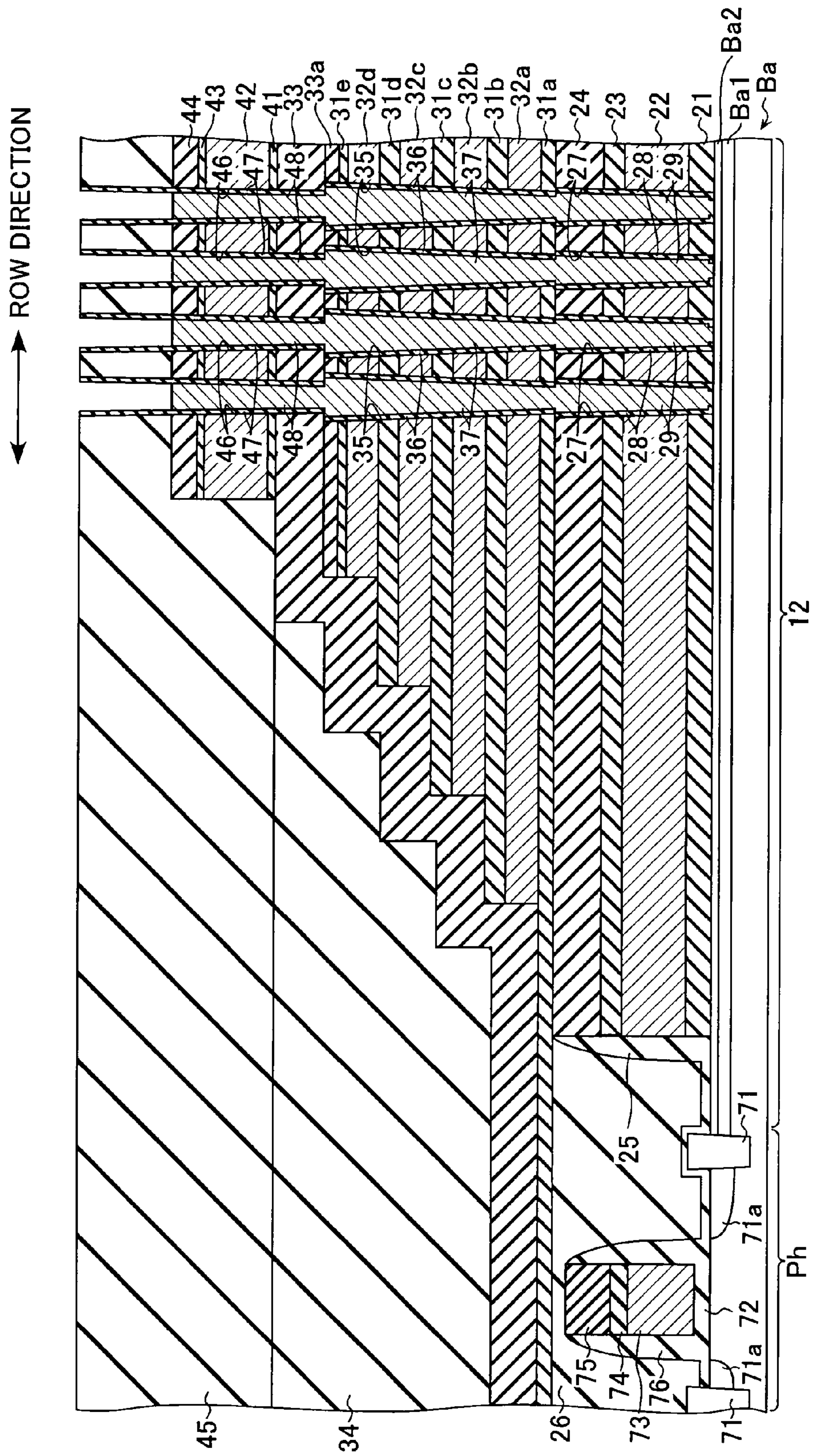
FIG. 21 is a cross-sectional view illustrating a manufacturing step of the nonvolatile semiconductor storage device according to the embodiment.

As shown in FIG. 21, amorphous silicon (a-Si) is deposited. Thereafter, the deposited portion is subject to the RIE treatment so that the height of the upper surface of the deposited amorphous silicon is adjusted and is subject to heat treatment. A pillar-shaped semiconductor layer is formed integrally so as to infill the continuous drain side hole 46, memory hole 35 and source side hole 27 by the above step. In other words, the drain side pillar-shaped portions 48 are formed so as to contact with the drain side gate insulating layers 47 in the drain side holes 46. The memory pillar-shaped portions 37 are formed so as to contact with the memory gate insulating layers 36 in the memory holes 35. The source side pillar-shaped portions 29 are formed so as to contact with the source side gate insulating layers 28 in the source side holes 27. That is to say, the drain side pillar-shaped portions 48, the memory pillar-shaped portions 37 and the source side pillar-shaped portions 29 are formed integrally so as not to have interfaces. Therefore, a natural oxide film is not formed between the drain side pillar-shaped portions 48, the memory pillar-shaped portions 37 and the source side pillar-shaped portion 29.

Figure 22:
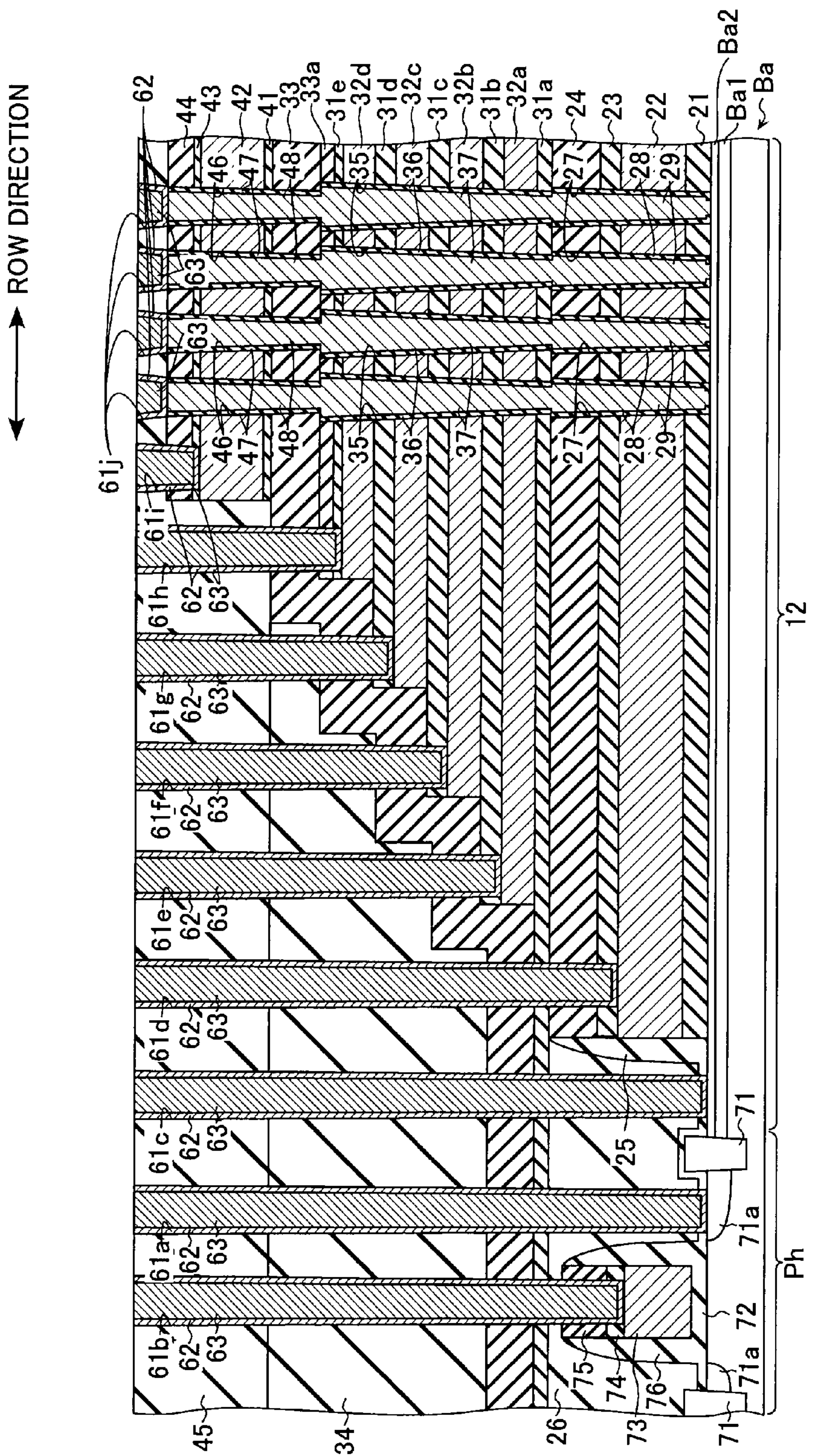
FIG. 22 is a cross-sectional view illustrating a manufacturing step of the nonvolatile semiconductor storage device according to the embodiment.

As shown in FIG. 22, the plug holes 61*a* to 61*i* are formed on the upper surface of the interlayer insulating layer 45. The plug hole 61*a* is formed so as to reach the source/drain area 71*a*. The plug hole 61*b* is formed so as to reach the gate conductive layer 73. The plug hole 61*c* is formed so as to reach the P-well area Ba2. The plug hole 61*d* is formed so as to reach the source side conductive layer 22. The plug holes 61*e* to 61*h* are formed so as to reach the first to fourth word line conductive layers 32*a* to 32*d*. The plug hole 61*i* is formed so as to reach the drain side conductive layer 42. Titanium-titanium nitride (Ti—TiN) and tungsten (W) are deposited on the upper portions of the source side holes 46 which serve as the plug holes 61*j*, so that the barrier metal layer 62 and the plug conductive layer 63 are formed.

Figure 23:
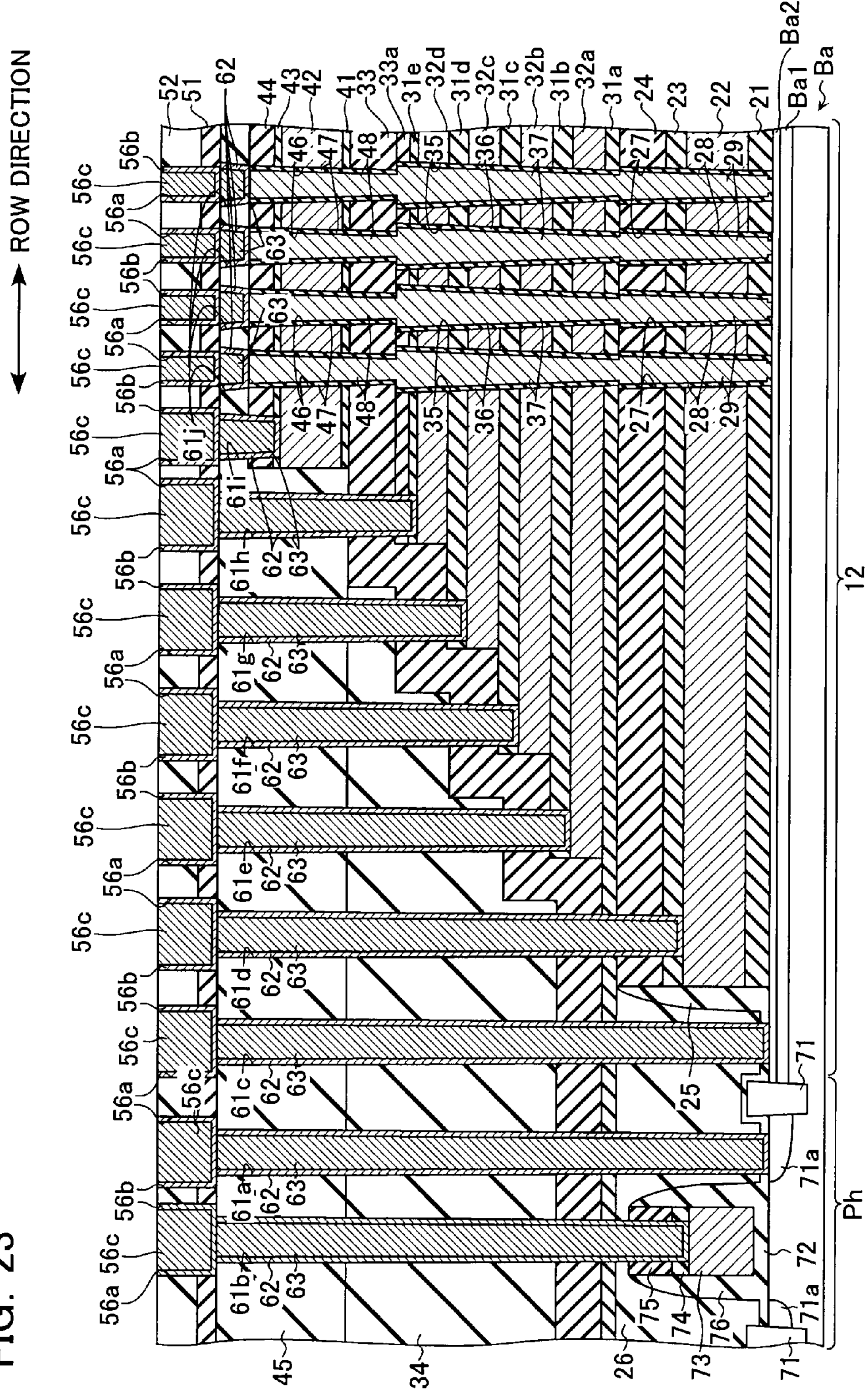
FIG. 23 is a cross-sectional view illustrating a manufacturing step of the nonvolatile semiconductor storage device according to the embodiment.

Subsequently, as shown in FIG. 23, silicon nitride (SiN) and silicon oxide ($SiO_2$) are deposited on the upper surface of the interlayer insulating layer 45, so that the wiring first insulating layer 51 and the wiring second insulating layer 52 are formed. The wiring first groove 56*a* is formed on the positions which match with the plug holes 61*a* to 61*j* so as to penetrate the wiring second insulating layer 52 and the wiring first insulating layer 51. Titanium-titanium nitride (Ti—TiN) and tungsten (W) are deposited in the wiring first groove 56*a*, so that the barrier metal layer 56*b* and the wiring first conductive layer 56*c* are formed.

After the step shown in FIG. 23, silicon oxide ($SiO_2$) is laminated on the upper surface of the wiring second insulating layer 52, so that the wiring third insulating layer 53 is formed. The wiring plug hole 57*a* is formed so as to penetrate the wiring third insulating layer 53. The wiring plug hole 57*a* is formed on the position which matches with the first wiring groove 56*a*. Titanium-titanium nitride (Ti—TiN) and tungsten (W) are deposited in the wiring plug hole 57*a*, so that the barrier metal layer 57*b* and the wiring plug conductive layer 57*c* are formed.

Subsequently, silicon nitride (SiN) and silicon oxide ($SiO_2$) are laminated sequentially on the upper surface of the wiring third insulating layer 53, so that the wiring fourth insulating layer 54 and the wiring fifth insulating layer 55 are formed. The wiring second groove 58*a* is formed so as to penetrate the wiring fifth insulating layer 55 and the wiring fourth insulating layer 54. The wiring second groove 58*a* is formed on the position which matches with the wiring plug hole 57*a*. Titanium-titanium nitride (Ti—TiN) and tungsten (W) are deposited in the wiring second groove 58*a*, and the barrier metal layer 58*b* and the wiring second conductive layer 58*c* are formed. The nonvolatile semiconductor storage device 100 according to the embodiment shown in FIG. 4 is formed by the above steps.

(Effect of the Nonvolatile Semiconductor Storage Device 100 According to the Embodiment)

An effect of the nonvolatile semiconductor storage device 100 according to the embodiment is described below. The nonvolatile semiconductor storage device 100 according to the embodiment can be highly integrated as described in the laminated structure. As described at the manufacturing steps, the nonvolatile semiconductor storage device 100 can be manufactured in such a manner that the respective layers to be the memory transistors MTrmn and the respective layers to be the source side selecting transistor SSTrmn and the drain side selecting transistor layer SDTrmn are laminated by the predetermined lithography steps regardless of the number of laminated layers. That is to say, the nonvolatile semiconductor storage device 100 can be manufactured inexpensively.

According to the manufacturing method, the source side sacrificing layer 81 and the memory sacrificing layer 82 are once formed, and the drain side holes 46 are formed. Thereafter, the source side sacrificing layer 81 and the memory sacrificing layer 82 are removed so that holes (the drain side holes 46 and the memory holes 35 and the source side holes 27) which continue from the upper layer to the lower layer are formed. Amorphous silicon is deposited integrally in the holes so that the pillar-shaped semiconductor layers without an interface (drain side pillar-shaped portions 48, the memory pillar-shaped portions 37 and the source side pillar-shaped portions 29) can be formed.

That is to say, in the manufacturing method for the nonvolatile semiconductor storage device according to the embodiment, resistance of the pillar-shaped semiconductor layer can be reduced further than a manufacturing method for laminating layers plural of times so as to form the pillar-shaped semiconductor layer.

Other Embodiments

The above described the embodiment of the nonvolatile semiconductor storage device, but the present invention is not limited to the above embodiment, and various modifications, additions and replacements are enabled within the scope which does not deviate from the gist of the present invention.

For example, in the method for manufacturing the nonvolatile semiconductor storage device 100 according to the embodiment, the pillar-shaped semiconductor layers (29, 37 and 48) are formed integrally so as to penetrate the laminated portions including the three layers: the source side selecting transistor layer 20; the memory transistor layer 30; and the drain side selecting transistor layer 40 from the lower layer to the upper layer. However, the present invention is not limited to the above embodiment.

For example, the method for manufacturing the nonvolatile semiconductor storage device according to the present invention may be the following manufacturing method according to first and second modified examples.

Figure 24:
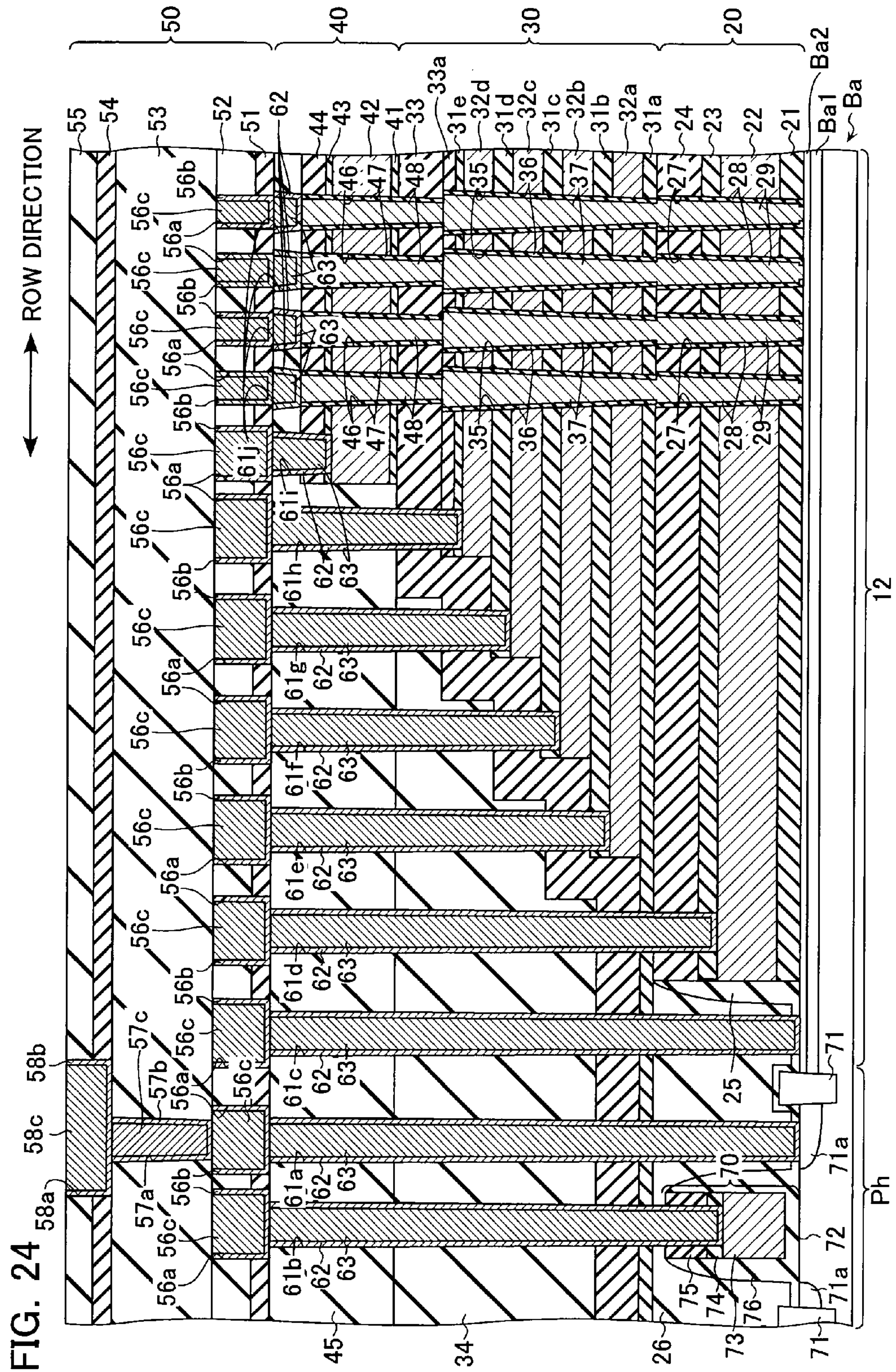
FIG. 24 is a cross-sectional view illustrating a nonvolatile semiconductor storage device according to another embodiment.

In the manufacturing method according to the first modified example, the memory gate insulating layer 36 is formed on the side walls of the memory holes 35 at the manufacturing steps similar to FIGS. 6 to 12. Next, the memory sacrificing layer 81 is removed, and the pillar-shaped semiconductor layers (the source side pillar-shaped portions 29 and the memory pillar-shaped portions 37) is formed so as to infill the source side holes 27 and the memory holes 35. After the manufacturing steps similar to FIGS. 14 to 19, the drain side pillar-shaped portions 48 are formed on the upper layers of the memory pillar-shape portions 37. The manufacturing steps similar to FIGS. 22 and 23 are used. The nonvolatile semiconductor storage device is constituted as shown in FIG. 24 by the above steps. That is to say, the source side pillar-shaped portions 29 are formed continuously to be integral with the memory pillar-shaped portions 37.

Figure 25:
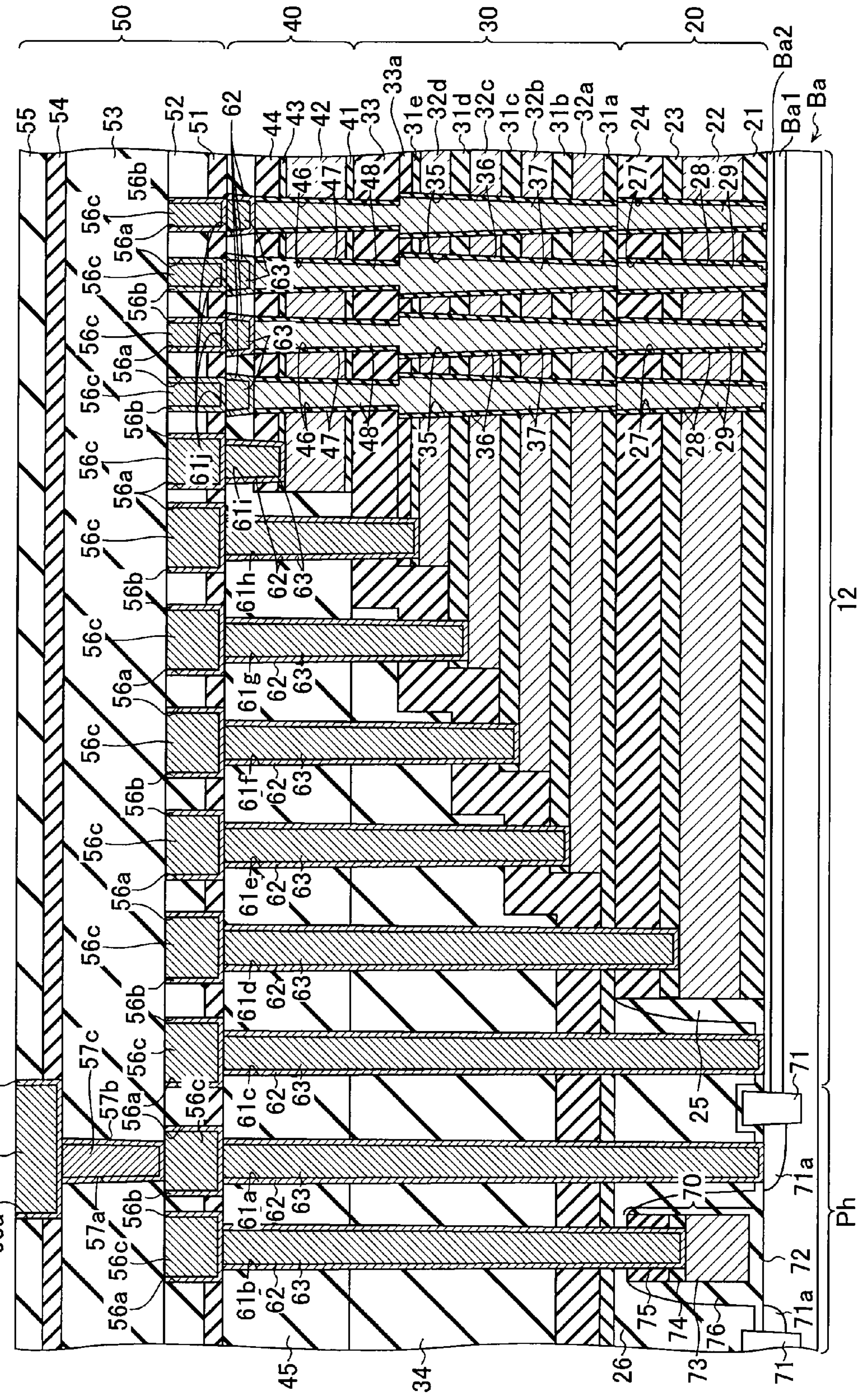
FIG. 25 is a cross-sectional view illustrating a nonvolatile semiconductor storage device according to another embodiment.

In the manufacturing method according to the second modified example, the source side sacrificing layer 81 composed of amorphous silicon is formed by the manufacturing steps similar to FIGS. 6 to 9. Next, the source side sacrificing layer 81 is subject to the heat treatment, so that the source side pillar-shaped portions 29 are formed. After the manufacturing steps similar to FIGS. 10 to 19, only the memory sacrificing layer 82 is removed, and the pillar-shaped semiconductor layers (the memory pillar-shaped portions 37 and the drain side pillar-shaped portions 48) are formed so as to infill the memory holes 35 and the drain side holes 46 above the source side pillar-shaped portions 29. Next, the manufacturing steps similar to FIGS. 22 and 23 are executed. The nonvolatile semiconductor storage device is constituted as shown in FIG. 25 by the above steps. That is to say, the drain side pillar-shaped portions 48 are formed continuously to be integral with the memory pillar-shaped portions 37.

That is to say, the method for manufacturing the nonvolatile semiconductor storage device of the present invention may include: forming a first conductive layer so that it is sandwiched by first insulating layers in an up-down direction; forming a first hole so that it penetrates the first insulating layer and the first conductive layer; forming a first side wall insulating layer on a side wall facing the first hole; forming a sacrificing layer so that the sacrificing layer infills the first hole, forming a second conductive layer on the upper layer of the sacrificing layer so that the second conductive layer is sandwiched by the second insulating layer in the up-down direction; forming a second hole on a position which matches with the first hole so that the second hole penetrates the second insulating layer and the second conductive layer; forming a second side wall insulating layer on a side wall facing the second hole; removing the sacrificing layer; and forming a semiconductor layer so as to infill the first hole and the second hole after the step of removing the sacrificing layer.

In the above manufacturing method, the first insulating layer corresponds to the source side first insulating layer 21 and the source side second insulating layer 22, and the second insulating layer corresponds to the first to fifth word interline insulating layers 31*a* to 31*e*. In another way, the first insulating layer corresponds to the first to fifth word interline insulating layers 31*a* to 31*e*, and the second insulating layer corresponds to the drain side first insulating layer 41 and the drain side second insulating layer 43. The first conductive layer corresponds to the source side conductive layer 22, and the second conductive layer corresponds to the first to fourth word line conductive layers 32*a* to 32*d*. In another way, the first insulating layer corresponds to the first to fourth word line conductive layers 32*a* to 32*d*, and the second conductive layer corresponds to the drain side conductive layer 42. The first hole corresponds to the source side hole 27, and the second hole corresponds to the memory hole 35. In another way, the first hole corresponds to the memory hole 35, and the second hole corresponds to the drain side hole 46. The first side wall insulating layer corresponds to the source side gate insulating layer 28, the second side wall insulating layer corresponds to the memory gate insulating layer 36. In another way, the first side wall insulating layer corresponds to the memory gate insulating layer 36, and the second side wall insulating layer corresponds to the drain side gate insulating layer 47.

For example, the source side sacrificing layer 81 and the memory sacrificing layer 82 in the above embodiment are composed of amorphous silicon (a-Si), but the present invention is not limited to the above structure. The source side sacrificing layer 81 and the memory sacrificing layer 82 may be composed of any material which can be selectively peeled from the source side gate insulating layer 28 and the memory gate insulating layer 36. For example, the source side sacrificing layer 81 and the memory sacrificing layer 82 may be composed of BSG or silicon germanium (SiGe).

In the above embodiment, for example, the source side pillar-shaped portions 29, the memory pillar-shaped portions 37 and the drain side pillar-shaped portions 48 are provided from the lower layer to the upper layer. However, the memory pillar-shaped portions 37 may be formed into a U shape viewed from a direction perpendicular to the laminated direction. In this case, the source side pillar-shaped portions 29 and the drain side pillar-shaped portions 48 may be formed on two upper surfaces (end portions) of the U-shaped memory pillar-shaped portion 37.

What is claimed is:

1. A method for manufacturing a nonvolatile semiconductor storage device, comprising:

forming a first insulating layer;

forming a first conductive layer on the first insulating layer;

forming a second insulating layer on the first conductive layer;

forming a first hole so that it penetrates the first insulating layer, the first conductive layer, and the second insulating layer;

forming a first side wall insulating layer on a side wall of the first hole;

forming a sacrificing layer so that the sacrificing layer fills in the first hole;

forming a third insulating layer on an upper layer of the sacrificing layer;

forming a second conductive layer on the third insulating layer;

forming a fourth insulating layer on the second conductive layer;

forming a second hole on a position which matches with the first hole so that the second hole penetrates the third insulating layer, the second conductive layer, and the fourth insulating layer;

forming a second side wall insulating layer on a side wall of the second hole;

removing the sacrificing layer after the formation of the second side wall insulating layer; and forming a semiconductor layer so that the semiconductor layer fills in the first hole and the second hole after the removal of the sacrificing layer.

2. The method for manufacturing a nonvolatile semiconductor storage device according to claim 1, wherein any one of the first conductive layer and the second conductive layer is constituted so as to serve as a control gate of an electrically rewritable memory cell, the other one of the first conductive layer and the second conductive layer is constituted so as to serve as a control gate of a selecting transistor for controlling a voltage to be applied to the memory cell.

3. The method for manufacturing a nonvolatile semiconductor storage device according to claim 1, wherein the sacrificing layer is composed of amorphous silicon or silicon germanium.

4. The method for manufacturing a nonvolatile semiconductor storage device according to claim 1, further comprising:

forming a fifth insulating layer before the step of forming the first insulating layer, the first conductive layer, and the second insulating layer;

forming a third conductive layer on the fifth insulating layer;

forming a sixth insulating layer on the third conductive layer;

forming a third hole so that it penetrates the fifth insulating layer, the third conductive layer, and the sixth insulating layer;

forming a third side wall insulating layer on a side wall of the third hole; and forming a sacrificing layer so that it fills in the third hole, wherein the first insulating layer, the first conductive layer, and the second insulating layer are formed on an upper layer of the sixth insulating layer, the first hole is formed on a position which matches with the third hole.

5. The method for manufacturing a nonvolatile semiconductor storage device according to claim 4, wherein the first conductive layer is constituted so as to serve as a control gate of an electrically rewritable memory cell, the second conductive layer and the third conductive layer are constituted so as to serve as control gates of a selecting transistor for controlling a voltage to be applied to the memory cell.

6. The method for manufacturing a nonvolatile semiconductor storage device according to claim 5, further comprising:

laminating a plurality of first conductive layers in a laminated direction via a plurality of second conductive layers; and forming end portions of the plurality of first conductive layers into a staircase pattern.

7. The method for manufacturing a nonvolatile semiconductor storage device according to claim 4, further comprising:

laminating a plurality of first conductive layers in a laminated direction via a plurality of second conductive layers; and covering end portions of the plurality of first conductive layers with a protection insulating layer.

8. The method for manufacturing a nonvolatile semiconductor storage device according to claim 4, further comprising:

laminating a tunnel insulating layer, a charge accumulating layer and a block insulating layer so as to form the first side wall insulating layer, wherein the tunnel insulating layer is formed so as to contact with a side wall of the first pillar-shaped semiconductor layer and is composed of silicon oxide, the charge accumulating layer is formed so as to contact with the tunnel insulating layer and is composed of silicon nitride, the block insulating layer is formed so as to contact with the charge accumulating layer and is composed of silicon oxide.

9. The method for manufacturing a nonvolatile semiconductor storage device according to claim 4, wherein the second side wall insulating layer and the third side wall insulating layer are composed of silicon oxide.

* * * * *